United States Patent [19]
Williamson et al.

[11] Patent Number: 5,027,410
[45] Date of Patent: Jun. 25, 1991

[54] ADAPTIVE, PROGRAMMABLE SIGNAL PROCESSING AND FILTERING FOR HEARING AIDS

[75] Inventors: Malcolm J. Williamson; Kenneth L. Cummins; Kurt E. Hecox, all of Madison, Wis.

[73] Assignee: Wisconsin Alumni Research Foundation, Madison, Wis.

[21] Appl. No.: 269,937

[22] Filed: Nov. 10, 1988

[51] Int. Cl.⁵ .............................................. H04R 25/00
[52] U.S. Cl. ................................ 381/68.4; 364/724.01
[58] Field of Search ....................... 381/68.4, 68, 68.2, 381/71, 73.1, 94, 104, 106, 107, 99; 333/166, 167, 168, 173, 14; 328/167; 364/724.01, 724.08, 724.09

[56] References Cited

U.S. PATENT DOCUMENTS

| | | | |
|---|---|---|---|
| 3,180,936 | 4/1965 | Schroeder | 381/94 |
| 3,403,224 | 9/1968 | Schroeder | 381/98 |
| 3,509,558 | 4/1970 | Cancro | 340/349 AD |
| 3,571,529 | 3/1971 | Gharib et al. | 381/72 |
| 3,784,749 | 3/1971 | Shigeyama et al. | 381/106 |
| 3,803,357 | 4/1974 | Sacks | 330/279 |
| 3,855,423 | 12/1974 | Brendzel et al. | 381/68.2 |
| 3,872,290 | 3/1975 | Crooke et al. | 381/106 |
| 3,894,195 | 7/1975 | Kryter | 369/48 |

(List continued on next page.)

FOREIGN PATENT DOCUMENTS

| | | |
|---|---|---|
| 67671/87 | 7/1987 | Australia . |
| 237203 | 9/1987 | European Pat. Off. . |
| 2407613 | 6/1979 | France ............................. 364/724.19 |
| 60-21612 | 2/1985 | Japan ..................................... 381/94 |
| 2184629A | 6/1987 | United Kingdom . |

OTHER PUBLICATIONS

Tavares, "Nature and Application of Digital Filters," The Engineering Journal (The Engineering Institute of Canada), vol. 50, No. 1, Jan. 1967, pp. 23–27.
Brochure entitled "The Heritage" by Zenith Hearing Aid Sales Corporation, (publication date unknown).
Rabiner et al., "Terminology in Digital Signal Processing," IEEE Trans. Audio Electro. Acoust., vol. AV-20, pp. 322–337, Dec. 1972.
Bader et al., "Programmgesteuertes Rauschfilter," Fernseh und Kino Technik, 1974, No. 8, pp. 231–233 (in German). Accompanying English translation (A Program Controlled Noise Filter).
Barford, "Automatic Regulation Systems with Relevance to Hearing Aids," Scandinavian Audiology Supplement, (6/1978), pp. 335–378.
Mangold et al., "Programmerbart Filter Hjalper Horselskade," Elteknik med Aktuell Elektronik, 1977,
(List continued on next page.)

Primary Examiner—Forester W. Isen
Attorney, Agent, or Firm—Foley & Lardner

[57] ABSTRACT

A hearing aid system utilizes digital signal processing to correct for the hearing deficit of a particular user and to maximize the intelligibility of the desired audio signal relative to noise. An analog signal from a microphone is converted to digital data which is operated on by a digital signal processor, with the output of the digital signal processor being converted back to an analog signal which is amplified and provided to the user. The digital signal processor includes a time varying spectral filter having filter coefficients which can be varied on a quasi-real time basis to spectrally shape the signal to match the hearing deficit of the user and to accommodate ambient signal and noise levels. The coefficients of the spectral filter are determined by estimating the energy in several frequency bands within the frequency range of the input signal, and using those energy estimates to calculate desired gains for the frequency bands and corresponding spectral filter coefficients. The spectral energy analysis may be carried out using pairs of high pass and low pass digital filters in cascade relation, with the output of each low pass filter being provided to the next pair of high pass and low pass filters. The rate at which output data is provided from the filters in each pair may be reduced from the sample rate of input data by one half for succeeding pairs of filters in the cascade to thereby reduce the computation time required.

58 Claims, 10 Drawing Sheets

U.S. PATENT DOCUMENTS

| | | | |
|---|---|---|---|
| 3,927,279 | 12/1975 | Nakamura et al. | 381/68 |
| 3,989,897 | 11/1976 | Carver | 381/68 |
| 3,989,904 | 11/1976 | Rohrer et al. | 381/68.4 |
| 4,025,721 | 5/1977 | Graupe et al. | 381/47 |
| 4,051,331 | 9/1977 | Strong et al. | 381/68.4 |
| 4,061,875 | 12/1977 | Freifeld et al. | 381/72 |
| 4,071,695 | 1/1978 | Flannigan et al. | 381/106 |
| 4,079,334 | 3/1978 | Hamilton | 330/279 |
| 4,099,035 | 7/1978 | Yanick | 381/68.2 |
| 4,112,254 | 9/1978 | Blackmer | 381/106 |
| 4,169,219 | 9/1979 | Beard | 369/48 |
| 4,185,168 | 1/1980 | Graupe et al. | 381/68 |
| 4,187,413 | 2/1980 | Moser | 381/68 |
| 4,188,667 | 2/1980 | Graupe et al. | 381/68.4 |
| 4,249,042 | 2/1981 | Orban | 381/106 |
| 4,297,527 | 10/1981 | Pate | 381/107 |
| 4,366,349 | 12/1982 | Adelman | 381/68.2 |
| 4,396,806 | 8/1983 | Anderson | 381/103 |
| 4,409,435 | 10/1983 | Ono | 381/68.2 |
| 4,425,481 | 1/1984 | Mansgold et al. | 381/68.2 |
| 4,454,609 | 6/1984 | Kates | 381/68 |
| 4,508,940 | 4/1985 | Steeger | 381/68.2 |
| 4,548,082 | 10/1985 | Engebretson et al. | 73/585 |
| 4,622,440 | 11/1986 | Slavin | 381/68.1 |
| 4,628,529 | 12/1986 | Borth et al. | 381/94 |
| 4,630,304 | 12/1986 | Borth et al. | 381/94 |
| 4,630,305 | 12/1986 | Borth et al. | 381/94 |
| 4,661,981 | 4/1987 | Henrickson et al. | 381/31 |
| 4,696,044 | 9/1987 | Waller, Jr. | 381/98 |
| 4,700,361 | 10/1987 | Todd et al. | 381/94 |
| 4,701,953 | 10/1987 | White | 381/46 |
| 4,723,294 | 2/1988 | Taguchi | 381/94 |
| 4,731,850 | 3/1988 | Levitt et al. | 381/68.2 |
| 4,747,143 | 5/1988 | Kroeger et al. | 381/47 |
| 4,783,818 | 11/1988 | Graupe et al. | 381/71 |
| 4,791,672 | 12/1988 | Nunley et al. | 381/68 |
| 4,792,977 | 12/1988 | Anderson et al. | 381/68.4 |
| 4,852,175 | 7/1989 | Kates | 381/68.4 |
| 4,887,299 | 12/1989 | Cummins et al. | 381/68.4 |

OTHER PUBLICATIONS

No. 15, pp. 64–66 (In Swedish). Accompanying English translation Programmable Filter Helps Hearing Imparied People.

Braida et al., "Hearing Aids—A Review of Past Research," ASHA Monographs, No. 19, 1979, pp. 54–56, section entitled Characteristics of Compression Amplifiers.

Mangold et al., "Programmable Hearing Aid with Multichannel Compression," Scandinavian Audiology 8, 1979, pp. 121–126.

Mangold et al., "Multichannel Compression in a Portable Programmable Hearing Aid," Hearing Aid Journal, Apr. 1981, pp. 6, 29, 30, 32.

Walker et al., "Compression in Hearing Aids: An Analysis, A Review and Some Recommendations", National Acoustics Laboratories, NAL Report, No. 30, Jun. 1982, Australian Government Publishing Service.

McNally, "Dynamic Range Control of Digital Audio Signals," J. Audio Eng. Soc., vol. 32, No. 5, May 1984, pp. 316–326.

Williamson, "Gisting Analysis" Rome Air Development Center Final Technical Report RADC-TR-84-130, Jun. 1984.

Stikvoort, "Digital Dynamic Range Compressor for Audio," J. Audio Eng. Soc., vol. 34, No. ½, Jan./Feb. 1986, pp. 3–9.

White, "Compression Systems for Hearing Aids and Cochlear Prostheses," Veterans Administration Journal of Rehabilitation Research and Development, vol. 23, No. 1, 1986, pp. 25–39.

Cummins et al., "Ambulatory Testing of Digital Hearing Aid Algorithms," RESNA 10th Annual Conference, San Jose, Calif., 1987, pp. 398–400.

P. J. Bloom, "High–Quality Digital Audio in the Entertainment Industry: An Overview of Achievements and Challenges," IEEE ASSP Magazine, Oct. 1985, pp. 2–25.

"TMS320 First-Generation Digital Signal Processors," brochure published by Texas Instruments, Jan. 1987.

P. O. Vaidyanathan, "Quadrature Mirror Filter Banks, M–Band Extensions and Perfect Reconstruction Techniques," IEEE ASSP Magazine, Jul. 1987, pp. 4–20.

ADAPTIVE, PROGRAMMABLE SIGNAL PROCESSING AND FILTERING FOR HEARING AIDS

FIELD OF THE INVENTION

This invention pertains generally to the field of audio signal processing and particularly to hearing aids.

BACKGROUND OF THE INVENTION

The nature and severity of hearing loss among hearing impaired individuals varies widely. Some individuals with linear impairments, such as that resulting from conductive hearing loss, can benefit from the linear amplification provided by conventional hearing aids using analog signal processing. Such aids may have the capacity for limited spectral shaping of the amplified signal using fixed low pass or high pass filters to compensate for broad classes of spectrally related hearing deficits. However, many types of hearing loss, particularly those resulting from inner ear problems, can result in non-linear changes in an individual's auditory system. Individuals who suffer such problems may experience limited dynamic range such that the difference between the threshold hearing level and the discomfort level is relatively small. Individuals with loudness recruitment perceive a relatively small change in the intensity of sound above threshold as a relatively large change in the apparent loudness of the signal. In addition, the hearing loss of such individuals at some frequencies may be much greater than the loss at other frequencies and the spectral characteristics of this type of hearing loss can differ significantly from individual to individual.

Conventional hearing aids which provide pure linear amplification inevitably amplify the ambient noise as well as the desired signal, such as speech or music, and thus do not improve the signal to noise ratio. The amplification may worsen the signal to noise ratio where an individual's hearing has limited dynamic range because the noise will be amplified above the threshold level while the desired speech signal may have to be clipped or compressed to keep the signal within the most comfortable hearing range of the individual.

Although hearing impaired individuals often have unique and widely varying hearing problems, present hearing aids are limited in their ability to match the characteristics of the aid to the hearing deficit of the individual. Moreover, even if an aid is relatively well matched to an individual's hearing deficit under certain conditions, such as a low noise environment where speech is the desired signal, the aid may perform poorly in other environments such as one in which there is high ambient noise level or relatively high signal intensity level.

SUMMARY OF THE INVENTION

In accordance with the present invention, digital signal processing is utilized in a hearing aid system which is both programmable to fit the hearing deficit of a particular user and adaptive to the sound environment to maximize the intelligibility and quality of the audio signal provided to the user. Background noise levels are reduced in either a fixed or an adaptive manner to enhance the signal to noise ratio of the desired signal, such as speech. The effective dynamic range of the user is expanded by maintaining high sensitivity for low intensity sound while providing long term automatic gain compression and output limiting control to insure that the sound signal does not exceed the comfort level of the wearer. The majority of normal sound signals, such as speech, are thereby provided to the user at levels which will best fit the available dynamic range of the user's ear. The audio signal provided to the user is also spectrally shaped to match and compensation for the specific spectral deficiency characteristics of the user's ear. The signal processing hearing aid further has several modes selectable at the user's choice which change the signal processing characteristics of the hearing aid to best accomodate the sound environment, such as the ambient noise level or the volume of the speech or music which the user wishes to listen to.

The signal processing hearing aid includes a microphone preferably located near or at the ear of the wearer, associated analog filtering and amplifying circuits, an analog to digital converter for converting the analog signal to digital data, a digital signal processor which operates on the digital data, a digital to analog converter for converting the processed data back to analog signal form, and analog filters and amplifiers which drive a receiver or speaker in an ear piece worn by the user. The signal from the microphone preferably receives pre-amplification and high pass filtering for pre-emphasis and is subjected to relatively slow automatic gain control to adjust the gain level to accommodate slowly varying sound levels. Anti-aliasing low pass filtering of the analog signal is performed before analog to digital conversion. In digital form, the signal data may be subjected to selectable high pass filtering and pre- and de-emphasis filtering if desired in combination with time varying spectral shaping digital filtering. The spectral shaping filtering is performed in accordance with prescribed spectral characteristics matching the hearing deficit of the particular user for whom the hearing aid is prescribed. In addition, the parameters of the spectral filter are variable to adjust the amplification so that the signal level is best matched to the expressed preference of the individual user, preferably with expansion of low level signals, normal amplification of intermediate level signals, and compression of high level signals. The processed digital data is then converted back to analog form and anti-imaging low pass filtering is performed on the signal before it is amplified and delivered to the speaker. The digital signal processor preferably has a programmable read only memory which can be programmed with the desired spectral shaping characteristics and variable amplification characteristics that fit the user.

The spectral filter of the digital signal processor has filter parameters which can be varied to provide a non-linear input-output characteristic in several frequency ranges. The input-output characteristics preferably include several piecewise linear sections. For example, a first section may have a slope greater than one to provide expansion of low level signals. At a first knee point, the slope of the input-output characteristic changes to a one to one or linear input-output relationship which is maintained up to a second knee. The range of output levels between the two knees preferably corresponds to that chosen by the user, usually a best fit to the dynamic range of the user's hearing so that most of second knee, the slope of the input-output characteristic is less than one to provide compression to reduce the effect of over-range signals and minimize loudness discomfort to the user. An estimate of the level of background noise is preferably made from the energy envelope of the input signal in various frequency ranges. This estimate of the noise is used to adjust the position of the first knee up or down and/or change the expansion ratio of the first section, with the calculated gain in the various frequency ranges being used to reduce the noise component of the amplified signal being supplied to the user. The slopes of the input-output curve above and below the knees may be changed and the initial position of the upper and lower knees may be changed in different modes of operation of the hearing aid to best accommodate the preference of the user as to the desired characteristics of the perceived sound, such as intelligibility, loudness or quality. For example, one set of slopes and knee values may be utilized in one mode while a second set of slopes and knee values may be used in another mode.

The time constants of the non-linear gain functions over which the gain at various frequencies remains substantially unchanged is an important characteristic which affects system performance. The longer the time constant, the less compression of short term level changes is achieved. However, the shorter the time constant, the more distortion is introduced for a given expansion or compression ratio. In the system of the present invention, different time constants may be used for the energy analysis in the different frequency bands. Preferred values for the time constants range from 4 milliseconds (ms) to 8 ms for the lowest frequency bands to 0.5 ms to 1 ms for the highest frequency band. Time constants in these ranges allow compression up to about 3.3 to 1 and expansion down to about 1 to 2 while keeping distortion at an acceptable level. The acceptable level of distortion depends upon the user, and more compression and/or expansion are acceptable to some users.

In a preferred embodiment, the time varying spectral filter is a digital filter having filter coefficients which can be varied on a quasi-real time basis to accomplish nonlinear amplification within the spectrum of the hearing aid to best accommodate ambient signal levels and noise levels. A single spectral filter is utilized which receives the digital data corresponding to the input signal after a time delay sufficient to accommodate the time required to calculate the coefficients which match the data being processed by the digital spectral filter. The digital signal processor carries out the computation of the spectral filter coefficients by first band pass filtering the input signal digital data to provide several sets of digital data corresponding to the portions of the signal lying within certain frequency ranges, e.g., 0 to 500 Hz, 500 Hz to 1 kHz, 1 kHz to 2 kHz, 2 kHz to 4 kHz, and 4 kHz to 8 kHz, assuming that the frequency content of the input signal is limited to approximately 8 kHz. The energy in each of the frequency range limited signals is then estimated, such as by taking the absolute value of the data and then low pass filtering it, and this energy estimate is then utilized as described above to determine an appropriate gain for the portion of the signal contained within that frequency range. Each frequency band may also have a baseline gain which is set to shape the frequency response of the system to compensate for spectrally related hearing deficiencies of a particular user. The calculated values for the gains are then used by the system to calculate the filter coefficients, such as in a finite impulse response filter implementation, for the time varying spectral filter. The coefficients of the filter are then changed and the delayed input signal data is then provided to the spectral filter. The coefficients of the spectral filter are updated in this manner to best accommodate the filter to the incoming signal. Because only estimation of the energy in the signal in each of the frequency bands is carried out, less computation is necessary than would be required for filtering the full signal in each of the frequency bands. A particularly significant advantage of the present system is that the input signal data passes through only one processing block, the time-varying spectral filter. In such a system there is less opportunity for quantization noise to enter the signal than in prior systems which split the input signal into several frequency bands which are operated on separately and then recombined to form the output signal, and the present system is less subject to distortion than such prior systems.

The energy analysis in each of the frequency bands is preferably carried out by operating on the input signal data and dividing it into two halves by a high-pass/low-pass pair of filters. Each of these filters contains half the band-width of the signal, so the rate at which the computations must be carried out can be reduced from the rate for the computations required to analyze the entire input signal frequency range. The high-pass half of the signal, containing the higher frequencies, is one octave wide and the energy in it can be estimated by a simple rectify and low-pass filter operation. The low-pass half of the signal is again filtered by a high-pass/low-pass pair of filters. Because the sampling rate has been halved, the cut off points of the digital filters are halved in frequency. The output from a high-pass filter can be rectified and low-pass filtered to estimate the energy in the frequency band and the output of the low-pass filter can again be filtered by a high-pass/low-pass pair of filters. In this way, it is possible to successively calculate the energy in portions of the input signal in narrower and narrower frequency bands, with lower and lower sampling rates. The high-pass and low-pass filters can be implemented by simple digital filters having e.g., coefficients $-1, 2, -1$ and $1, 2, 1$. Such filters are fairly shallow with 12 dB per octave rolloff, but have only three simple integer taps each and the sum of the two filters is flat across the spectrum. More complicated filters also can be used. The number of operations needed in the energy analysis circuit is very small, mainly because so much of the filtering is done on streams of data which have been decimated to successively slower rates. Consequently, the computation time required to determine the coefficients is reduced and the amount by which the input signal must be delayed to match the coefficients is also reduced, allowing the processing system to function in a real time manner, with a processing delay which is inperceptible to the listener.

Further objects, features, and advantages of the invention will be apparent from the following detailed description when taken in conjunction with the accompanying drawings.

DESCRIPTION OF THE PREFERRED EMBODIMENT

Figure 1:
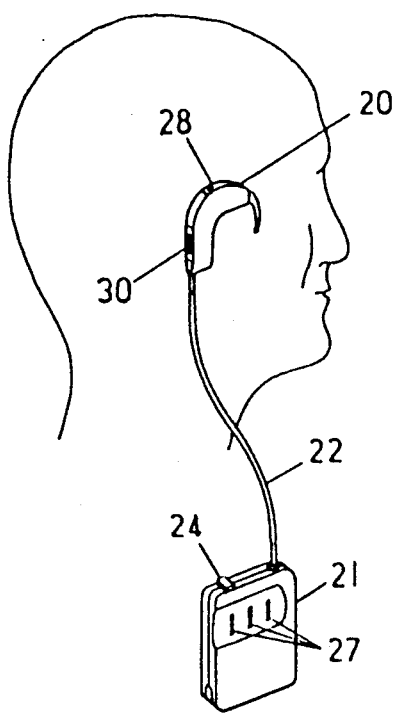
FIG. 1 is an illustrative view showing the major components of the adaptive signal processing hearing aid of the present invention as worn by a user.

An illustrative view of one style of an adaptive, programmable signal processing hearing aid in accordance with the present invention is shown generally in FIG. 1, composed of an ear piece 20 and a body aid or pocket processing unit 21 which are connected by a wiring set 22. It is, of course, apparent that the hearing aid can be incorporated in various standard one piece packages, including behind-the-ear units and in-the-ear units, depending on the packaging requirements for the various components of the aid and power requirements. As explained further below, the pocket processing unit 21 includes a power on-off button 24 and mode control switches 27. The mode switches 27 can optionally provide selection by the user of various operating strategies for the system which suit the perceived preference of the user. The mode switches allow the user to select the mode which best suits his subjective perception of the sound from the aid. As explained further below, the hearing aid system is programmable to adapt the signal processing functions carried out in each of the modes to the hearing deficit of the user for whom the hearing aid is prescribed. A volume control dial 28 is also provided on the ear piece 20 to allow user control of the overall volume level.

Figure 2:
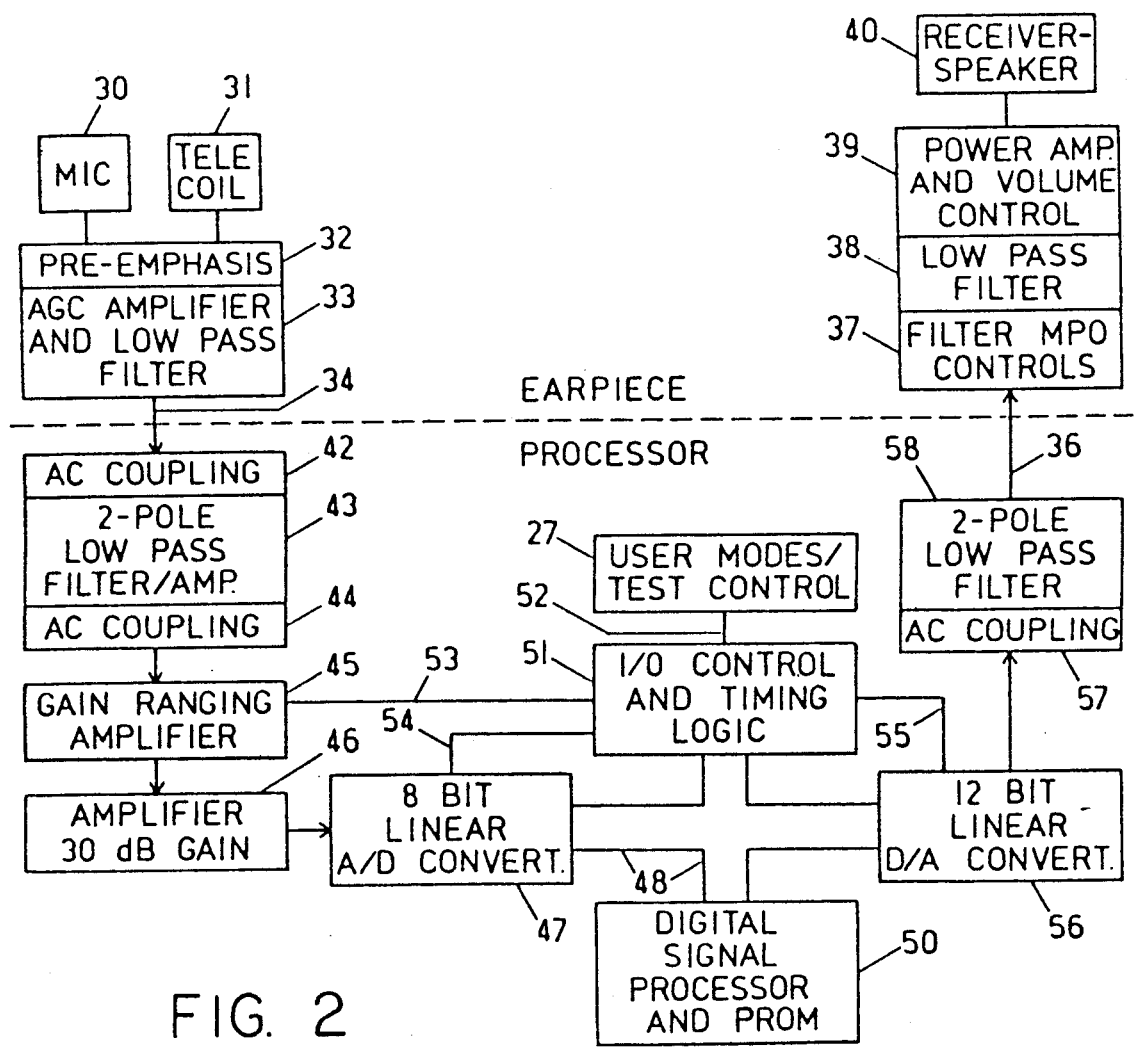
FIG. 2 is a schematic block diagram of the hardware components of the adaptive signal processing hearing aid of the invention.

A hardware block diagram of the ear piece unit 20 and pocket processor unit 21 is shown in FIG. 2. The ear piece includes a microphone 30 which can be of conventional design (e.g., Knowles EK3027 or Lectret SA-2110). The ear piece may also optionally include a telecoil 31 to allow direct coupling to audio equipment. The output signal from the microphone 30 or telecoil is provided to an analog pre-amplifier/pre-emphasis circuit 32 which amplifies the output of the microphone (or telecoil) and provides some high pass filtering (e.g., 6 dB per octave) to provide a frequency spectrum flattening effect on the incoming speech signal which normally has a 6 dB per octave amplitude roll off. This pre-emphasis serves to make the voiced and unvoiced portions of speech more equal in amplitude, and thus better suited to subsequent signal processing. In particular, the pre-emphasis reduces the dynamic range of the speech signal and so reduces the number of bits needed in the analog to digital converter. The output of the pre-amplifier/pre-emphasis circuit is provided to an automatic gain control circuit and low pass filter 33. The automatic gain control (AGC) circuit attempts to maintain the long-term root-mean-square (RMS) input level at or below a specified value to minimize dynamic range requirements for the analog to digital converter which is used to convert the analog signal to a digital signal. Preferably, RMS inputs below 70-75 dB SPL (at 4 kHz) are amplified linearly with about 40 dB gain, resulting in a 45 mV RMS signal level (e.g., 0.125 V peak to peak for a 4 kHz sine wave) which will be provided to the analog to digital converter. Inputs between 75 dB and 95 dB are maintained at the 45 mV level for the long term average. Inputs above 95 dB preferably have a gain less than 15 dB, and will be hard-clipped at the one volt peak to peak level. However, it is apparent that the total gain received by the listener can be selected either more or less than these values depending on the subsequent digital signal processing and the analog output stage.

To minimize the interaction between speech modulation (syllabic) and the AGC circuit, the attack time is preferably approximately 300 milliseconds (msec) and the release time is approximately 2.5 seconds. This long term AGC function is desirable to allow the total gain to the user to be automatically adjusted to provide a comfortable listening level in situations where the user can control the signal level but not the noise level, for example, in using the car radio, watching television in a noisy environment, and so forth. The time-constants are chosen long enough so that the AGC is not affected by syllabic changes in speech level.

The output of the automatic gain control circuit is provided on signal lines 34 (forming part of the connecting line 22) to the main body or pocket processor unit 21. The ear piece also receives an output signal on lines 36 from the pocket processor. This output signal is received by a maximum power output control circuit 37 which is adjusted by the fitter. The signal then is provided to a low pass filter 38 and a power amplifier and volume control circuit 39 and finally to the receiver transducer or speaker 40 (e.g., Knowles CI-1762) for conversion to a corresponding sound. The analog output power amplifier 39 (e.g., an LTC 551 from LTI, Inc.) determines the overall system gain and maximum power output, each of which can be set by a single component change. The output of this amplifier is preferably hard limited to protect against malfunctions.

The signal on the line 34 from the ear piece is received by the pocket processor through an AC coupler 42 and is passed to a two pole low pass filter amplifier 43 and thence through an AC coupler 44 to a gain ranging amplifier 45 (e.g., Analog Devices AD 7118). The output of the gain ranging amplifier 45 is provided to a 30 dB gain amplifier 46 which provides its output to a linear analog to digital converter 47 (e.g., Analog Devices AD 7575). The A to D converter 47 is connected to provide its digital output to the data bus 48 of a digital signal processor 50 which may include a microprocessor, a random access memory and a programmable read only memory (PROM) for storing the program and the prescribed parameters adapting the hearing aid to a particular patient. An example of a suitable signal processor is a TMS 320E15 from Texas Instruments. The digital signal processor data bus is also connected to input/output control and timing logic 51 which is connected to the user mode control switches 27 by control lines 52, by control lines 53 to the gain ranging amplifier 45, and by a control line 54 to the analog to digital converter 47. The control logic is also connected by a control line 55 to a 12 bit linear digital to analog converter 56 which is also connected to the data bus 48 of the digital signal processor. The analog output from the D to A converter 56 (e.g., an Analog Devices AD 7545 and a current to voltage converter) is provided through AC coupling 57 to a 2 pole low pass filter 58 which delivers the filtered output signal on the lines 36 to the ear piece. The amplifiers and filters may utilize, for example, TLC27M operational amplifiers and the logic circuitry is preferably 74HC series for low power operation.

Figure 3:
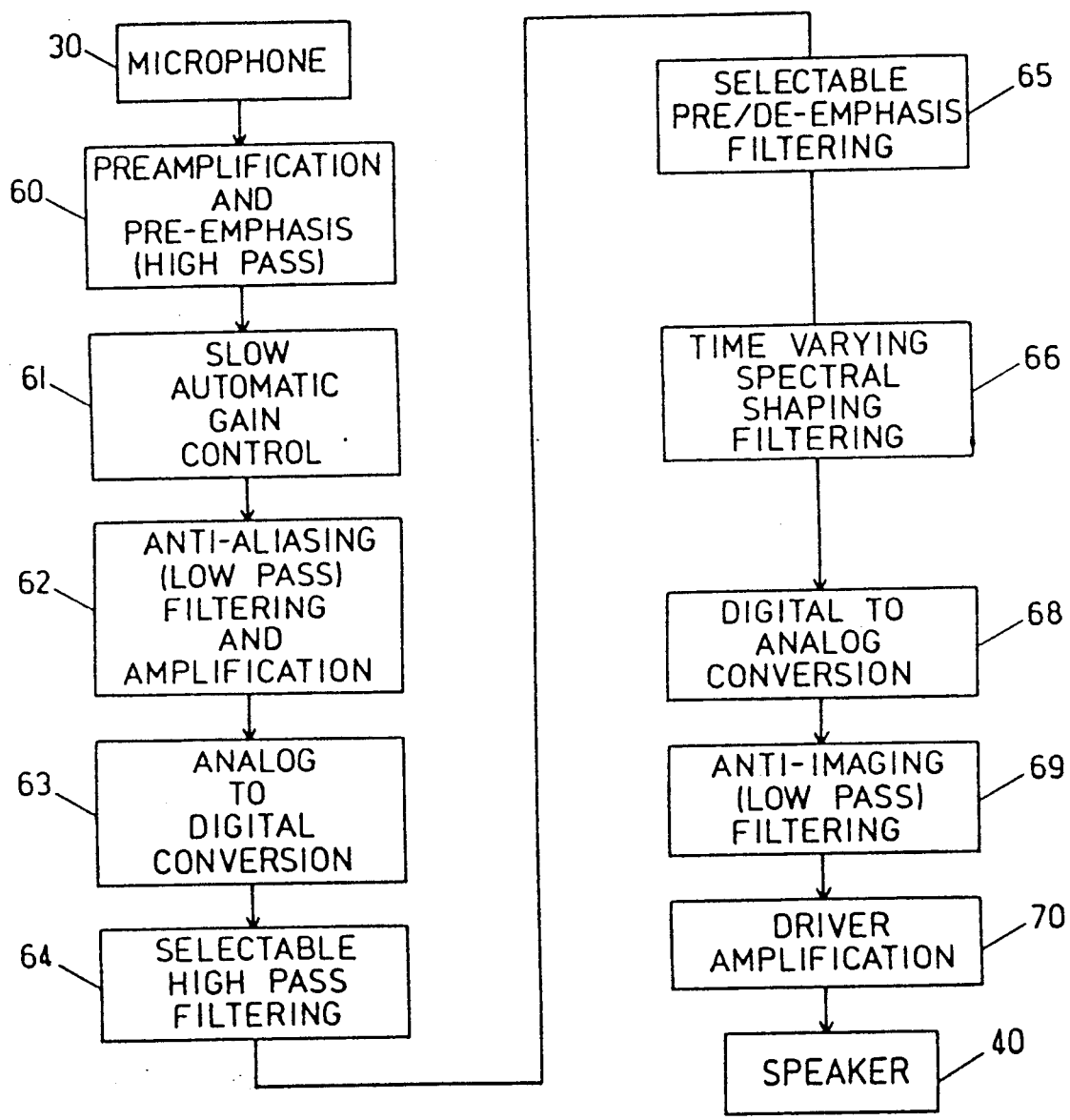
FIG. 3 is a signal flow diagram showing the operations performed on the signals from the microphone to the speaker in the hearing aid of the invention.

The spectral shaping of the sound signal to best compensate for the user's hearing deficit and the desired amplitude compression and noise reduction are carried out in the digital signal processing components. A flow diagram of a preferred embodiment for signal flow through the hearing aid system is shown in FIG. 3. The input signal from the microphone 30 is initially preamplified and provided with pre-emphasis, preferably at 6 dB per octave (block 60) which is carried out by the pre-emphasis circuit 32, and then has slow automatic gain control performed on the amplified and pre-emphasized signal (block 61) which is performed in the AGC amplifier and filter section 33. The gain controlled signal is then passed through an anti-aliasing low pass filter (block 62) after which the analog signal is converted to digital data (block 63). The low pass anti-aliasing filtering is performed both in the AGC amplifier and low pass filter circuit 33 and in the 2 pole low pass filter and amplifier 43 to reduce the higher frequency content of the signal to minimize aliasing. For example, if the analog to digital conversion is performed at 14,000 samples per second, the anti-aliasing filtering preferably substantially attenuates signal power above about 7,000 Hz.

After analog to digital conversion, the processing of the signal is carried out digitally in the digital signal processor 50. The digital data is first subjected to a selectable high pass filtering step (block 64) which, if used, has a high pass frequency of about 100 Hz to filter out DC components of the signal and thereby get rid of DC offsets that may exist in the data.

The data is then optionally subjected to selectable pre or de-emphasis filtering (block 65). If pre-emphasis is selected, the filtering is flat to about 1 kHz and then rises at 6 dB per octave above that. De-emphasis is flat to about one kHz and falls at 6 dB per octave above that. A further option is no filtering at all. The choice between the filter options is made on the basis of the general shape of the patient's audiogram and subjective decisions made by the user during the fitting process.

The filtered data is then subjected to time varying spectral shaping filtering (block 66). The spectral filter provides shaping of the gain spectrum to match the individual who will be using the aid and to provide an acoustic equalization function for the entire system. The shaping filter allows, e.g., up to 12 dB per octave of gain control with up to 36 dB of total shaping. It is possible to obtain the desired shaping to within 3 dB over the 500 Hz to 6 kHz range.

The filter coefficients which define the characteristics of the spectral filter change over time to adapt to the magnitude and estimated noise content of the signal being processed. In each of several frequency ranges of the input signal, a gain is determined, and the several gain values are used to determine the spectral filter coefficients. In general terms, the gain function can be described as having a curve which is tailored to the individual and which has regions of increasing gain (expansion), constant gain (linear operation) and decreasing gain (compression). By utilizing signal and noise tracking functions, the entire curve or portions of it can change shape and position to best control noise, maintain comfortable loudness of the signal, and prevent uncomfortable loudness of intense sounds. The characteristics of this function, and its interaction with the spectral shaping in the prior filter sections, determines how the input signal and noise levels are transformed to output signals and noise levels across the frequency range. The rapid response time of the time varying spectral filter helps to improve intelligibility of quiet sounds following loud transients. More particularly, the system allows tracking of long term signal and noise levels and the use of estimates of these levels to maintain the output speech sound at a level which will be comfortable to the user while simultaneously controlling noise.

After completion of the digital signal processing, the digital data is converted to an analog signal (block 68) in the digital to analog converter 56 and the converted signal is subjected to anti-imaging low pass filtering (block 69) carried out by the filters 58 and 38, to minimize imaging introduced by the digital to analog conversion. Finally the filtered signal is subjected to power amplification (block 70) in the power amplifier circuit 39 and is passed to the receiver or speaker 40.

The noise suppression, loudness limiting and frequency shaping are all accomplished by the combination of an energy estimation algorithm and a time-varying filter. The energy estimation algorithm calculates the energy in a number (preferably 5) of frequency bands. These estimates are used to decide on the current gains or attenuations for each of the bands. The time-varying filter then implements the gains or attenuations.

The estimation of energy in each frequency band is preferably done in a novel and highly efficient manner in accordance with present invention. One way which could be used to estimate the energies in each band would be to use a digital filter bank and then rectify and low pass filter the outputs. For a number of filters equal to N for example, the five filter blocks 131 to 135 in FIG. 8), each with M taps (N=5, M=31 are reasonable numbers) this would require about N*(M+2) multiplications and the same number of additions for each input sample. In accordance with the present invention, the preferred algorithm utilizes 5 additions and 1 shift per sample. To achieve this large saving in computation, a particular type of filter bank is required. If the sampling frequency is F, the highest filter must be from F/2 to F/4, the next from F/4 to F/8 and so on. Each of the filters is 1 octave wide, except for the lowest filter which includes the range down to zero frequency. For example, if the sampling frequency is 16 kHz, the filter network can have bands from 8 kHz to 4 kHz, 4 kHz to 2 kHz, 2 kHz to 1 kHz, 1 kHz to 500 Hz and 500 Hz to 0 Hz.

Figure 9:
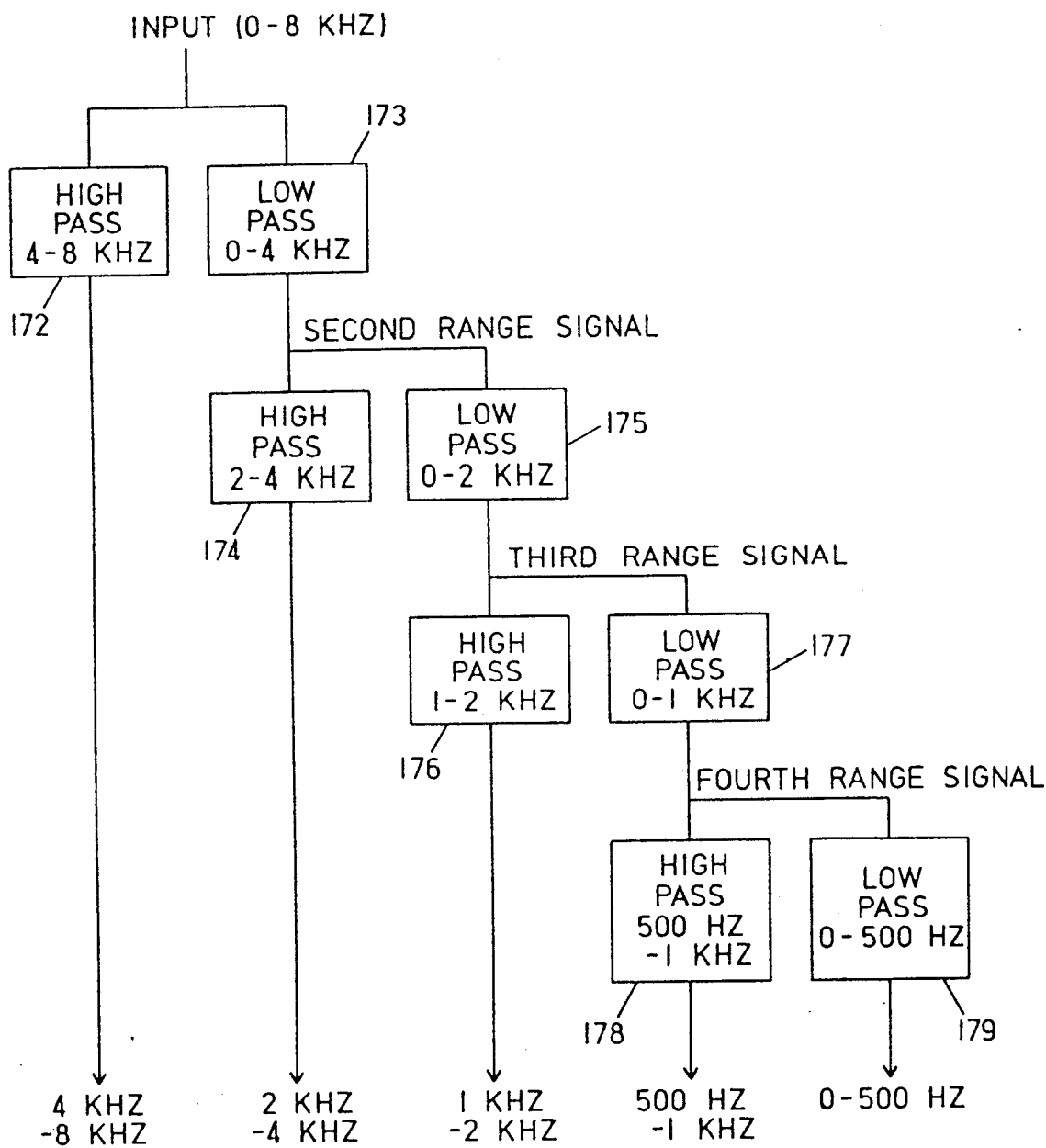
FIG. 9 is a schematic block diagram illustrating a preferred implementation of the energy analysis function of the time varying spectral filter.

The highly efficient computation is achieved by running different parts of the effective network at different rates, as illustrated in FIG. 9. The first stage of filtering divides the signal into 2 streams, one passed by a high pass filter 172 containing the upper half of the spectrum and the other passed by a low pass filter 173 containing the lower half of the spectrum. Each of the two streams is at half the rate of the original data stream. Then the lower of the two streams, constituting a second signal, is halved in the same way by a high pass filter 176 and low pass filter 175, the output of which is a third signal with the output of the low pass constituting a fourth signal, and a high pass filter 178 and low pass filter 179, the latter providing an output signal with frequency content down to zero frequency. The process is repeated for each of the other octave bands, using a high pass filter 176 and low pass filter 177. The sample rate is reduced for each pair of filters, until the input frequency range is divided into the number of bands desired. Each filter in the low-pass and high-pass pair may be very simple, e.g., having coefficients 1, 2, 1 and $-1, 2, -1$, respectively. These are fairly shallow filters with 12 db/octave roll-off, but they have only three simple integer taps each and the sum of the two filters is flat across the spectrum. More complicated filters may be used but they would not have these useful properties.

More generally, the energy analysis is performed using N pairs of high pass and low pass digital filters, the high pass filter in each pair selected to pass the highest half of the frequency range of the input signal to the pair and the low pass filter in the pair selected to pass the lowest half of the frequency range of the input signal to the pair. The number N of filter pairs is at least two. The pairs of filters are cascaded, as illustrated in FIG. 9, so that the input signal to each pair after the first pair is the output of the low pass filter of the prior pair of filters. Means are provided for estimating the energy in the output from the N high pass filters and from the last low pass filter. These energy estimates correspond to the energy present in the input audio signal in the specific frequency bands which are defined by the cascaded pairs of filters. It is preferred, that these frequency bands correspond to octaves which cover the frequency range of the input signal. Other frequency bands may be used, but generally will result in more complex filters and greater computational time than octave bands.

The computation of output values from the first pair of high pass and low pass filters is preferably performed at half the sample rate for the input signal; e.g., if the sampling rate is 16 kHZ, the output rate from the high and low pass filters would be 8 kHZ. This halved computation rate is acceptable because the analysis network is estimating the energy in each frequency band in the input signal, but is not reconstructing the signal by combining band pass filtered portions of the signal. The computation of output values for the succeeding pairs of high pass and low pass filters is performed at a rate which is a fraction of the sample rate equal to $\frac{1}{2}^{n+1}$, where n is the number of prior filter pairs. For example, for the fourth pair of filters 178 and 179 of FIG. 9, there are three prior pairs of filters (n=3), and the computation rate is $\frac{1}{2}^4 = 1/16$ times the sample rate.

The analysis network is equivalent to a set of FIR filters. Each stage contributes a 3-tap filter with coefficients 1, 2, 1 (for the low-pass filter) or $-1, 2, -1$ (for the high-pass filter). The network cascades these simple filters, and each cascade is equivalent to the convolution of its component 3-tap filters. The coefficients of the resulting FIR filters are listed below. These are the coefficients used in both the analysis algorithm and the time-varying FIR filter, as described further below.

Filters

| tap number | 4 kHz–8 kHz | 2 kHz–4 kHz | 1 kHz–2 kHz | 500 Hz–1 kHz | 0 Hz–500 Hz |
|---|---|---|---|---|---|
| 1  |     |     |      | $-1$  | 1  |
| 2  |     |     |      | $-2$  | 2  |
| 3  |     |     |      | $-3$  | 3  |
| 4  |     |     |      | $-4$  | 4  |
| 5  |     |     |      | $-5$  | 5  |
| 6  |     |     |      | $-6$  | 6  |
| 7  |     |     |      | $-7$  | 7  |
| 8  |     |     |      | $-8$  | 8  |
| 9  |     |     | $-4$  | $-5$  | 9  |
| 10 |     |     | $-8$  | $-2$  | 10 |
| 11 |     |     | $-12$ | 1     | 11 |
| 12 |     |     | $-16$ | 4     | 12 |
| 13 |     | $-16$ | $-4$  | 7   | 13 |
| 14 |     | $-30$ | 8     | 10  | 14 |
| 15 | $-64$ | 16  | 20    | 13  | 15 |
| 16 | 128 | 64   | 32    | 16  | 16 |
| 17 | $-64$ | 16  | 20    | 13  | 15 |
| 18 |     | $-32$ | 8     | 10  | 14 |
| 19 |     | $-16$ | $-4$  | 7   | 13 |
| 20 |     |     | $-16$ | 4     | 12 |
| 21 |     |     | $-12$ | 1     | 11 |
| 22 |     |     | $-8$  | $-2$  | 10 |
| 23 |     |     | $-4$  | $-5$  | 9  |
| 24 |     |     |      | $-8$  | 8  |
| 25 |     |     |      | $-7$  | 7  |
| 26 |     |     |      | $-6$  | 6  |
| 27 |     |     |      | $-5$  | 5  |
| 28 |     |     |      | $-4$  | 4  |
| 29 |     |     |      | $-3$  | 3  |
| 30 |     |     |      | $-2$  | 2  |
| 31 |     |     |      | $-1$  | 1  |

The energy estimation network gives energies for each of the bands. These are used together with the noise level estimates to calculate the desired gain in each band. The user specific spectral shaping is also added in this calculation. The gains are then used to calculate the coefficients of the filter. Preferably this digital filter is non-recursive and 31 long so that 16 coefficients are needed (if the filter is symmetrical) and the calculation is done at intervals of 1 millisecond. The calculated filter acts on the incoming signal and is the only operation on the audio signal in the path from input to output. By conducting the processing in this manner, the chance of any clipping or quantization distortion at intermediate states of the system is eliminated to as great an extent as possible. It is also computationally very efficient, reducing the number of execution steps required and thus allowing either faster computation or lower power consumption, or both.

The combination of the energy estimation algorithm and time-varying filter is used to implement a non-linear amplifier in each of the frequency bands. There can be a different shape of input-output function in each of the bands.

Figure 4:
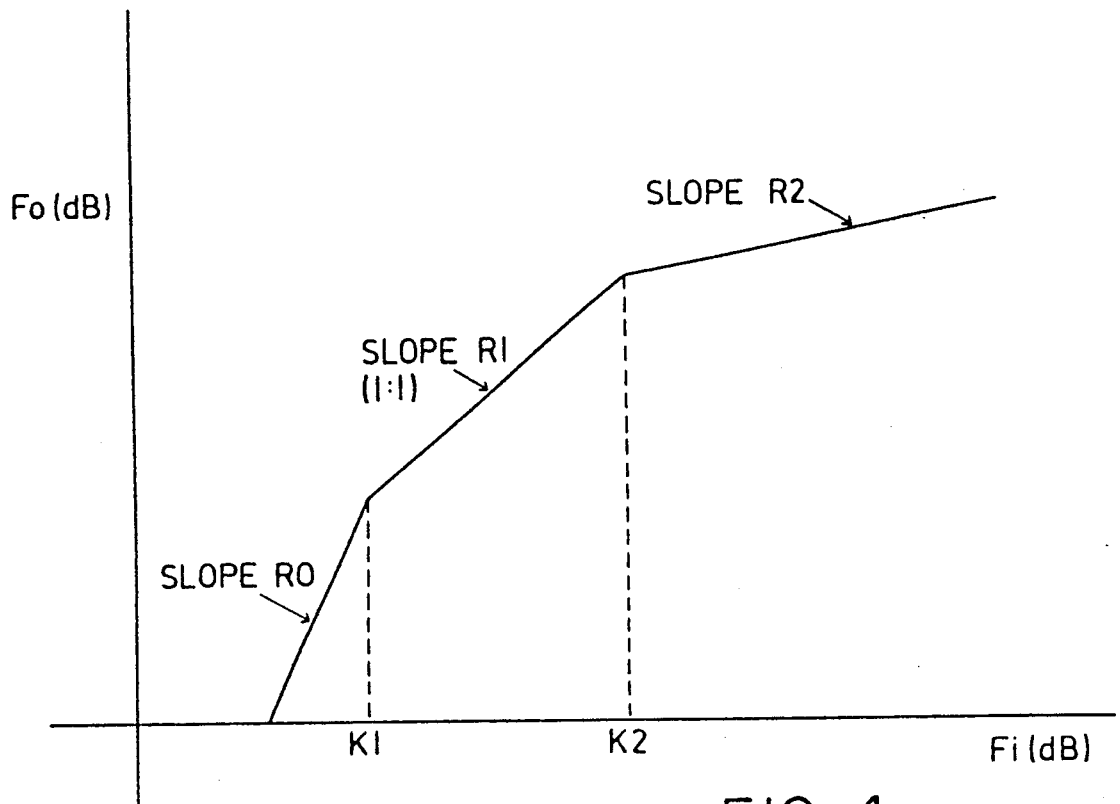
FIG. 4 is a graph showing the gain function characteristics for determining the gains to be used in calculating the digital spectral filter coefficients of the digital signal processor within the hearing aid.

The operation of each non-linear gain function within the spectral filter can be most readily illustrated by assuming it receives a single time varying input signal X(t) and provides a time varying output signal Y(t), with the internal operations being performed on the digital input X(T) and yielding the digital output Y(T). By denoting $F_i$ as the log magnitude envelope (in dB) of the input signal X(t) and $F_o$ (in dB) as the log magnitude envelope of the output signal y(t), a preferred input-output relationship between $F_i$ and $F_o$ is shown in FIG. 4. At low input signal levels, the adaptive amplifier provides increasing gain to the input signal, i.e., the slope R0 of the $F_i$-$F_o$ curve is greater than one (expansion). This allows low level background noise to be attenuated relative to the speech signal. As the magnitude of the input signal goes above a selected level, denoted K1 in FIG. 4, the slope of the next piecewise linear $F_i$-$F_o$ curve segment is R1, which is preferably one. This gives a normal constant amplification for signals which have a magnitude, for example, in the normal speech range. Preferably, the gain function is selected for an individual user so that these input signals in the normal speech range will map to output signals from the hearing aid which are within the preferred dynamic range of the user's hearing. For signals above a higher selected magnitude, denoted K2 in FIG. 4, the slope R2 of the piecewise linear segment of the gain curve is less than one, resulting in compression of the output signal. The level of K2 is preferably selected so that signals which will exceed the sound level at which the wearer is most comfortable will be compressed. The three piecewise linear segments for the input-output curve of FIG. 4 thus together serve to provide expansion of weak signals, normal amplification of normal speech signals, and compression of strong signals. Additional piecewise linear segments may be used if desired, and the curve may also be implemented with nonlinear segments and discontinuities. The three piecewise linear segment implementation is generally sufficient to provide adequate adaptation to the entire range of signal levels.

The gain function of FIG. 4 is implemented with the energy magnitude envelope E(T) serving as an estimate of the magnitude of the input signal X(T) at a time T calculated over a sample period during which the actual magnitude of the signal is assumed to be relatively constant. At the time T, the three piecewise linear segments of the curve of FIG. 4 can be represented by the following equations wherein L(T)=20 log E(T):

For $L(T) < K1$: $Fo = A + L(T) + (R0-1)[L(T)-K1]$

For $K1 \leq L(T) \leq K2$: $Fo = A + L(T)$

For $K2 < L(T)$: $Fo = A + L(T) + (R2-1)[L(T)-K2]$ where A is a constant basic gain in dB.

If H(T) is the magnitude envelope of the output signal y(t) at the time T, then Fo=20 log H(T).

For each sample time T $$Y(T) = G(T)*X(T).$$

Therefore, averaging values over a short time period:

$$H(T) = G(T)*E(T)$$

and $$20 \log H(T) = 20 \log G(T) + 20 \log E(T)$$

Figure 5:
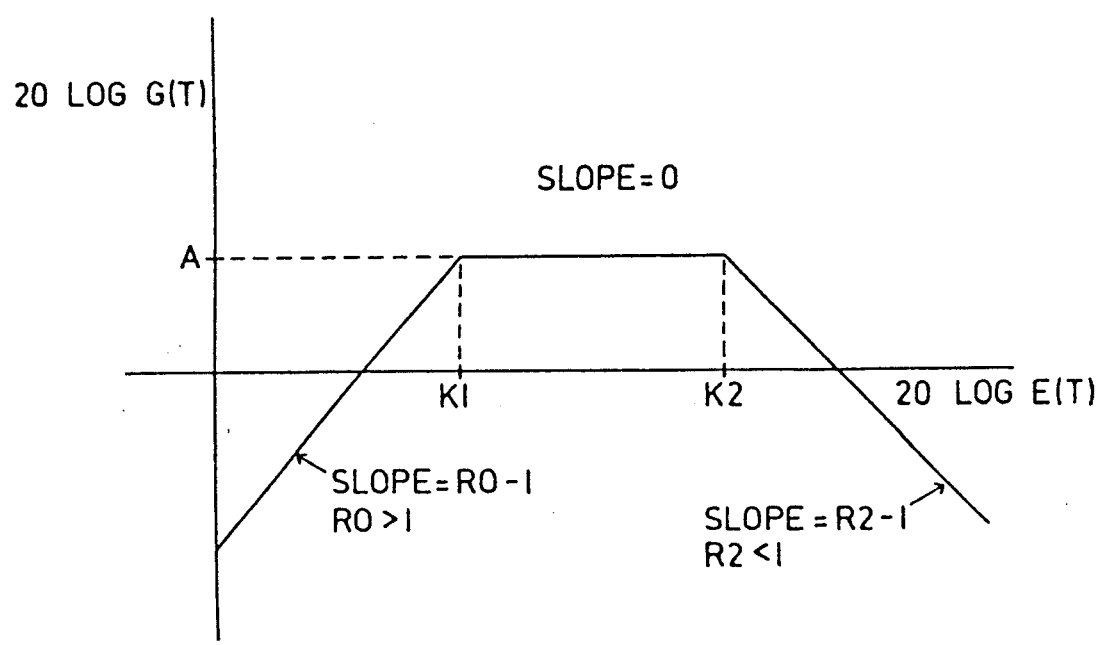
FIG. 5 is a graph showing the relationship between estimated energy within a frequency band in the input signal and the gain for that frequency band to be used in calculating the coefficients of the digital spectral filter.

The equations above for the input-output segments can thus be written as:

$20 \log G(T) = A + (R0 - 1)(20 \log E(T) - K1)$ $20 \log G(T) = A$ and $20 \log G(T) = A + (R2 - 1)(20 \log E(T) - K2)$ A plot of the gain function 20 log G(T) verses 20 log E(T) is shown in FIG. 5.

These equations can also be expressed in non-logarithmic form as:

$$G(T) = 10^{A/20} \left[ \frac{E(T)}{10^{K1/20}} \right]^{(R0-1)}$$

for $E(T)$ less than $10^{K1/20}$;

$$G(T) = 10^{A/20}$$

for $10^{K1/20} \leq E(T) \leq 10^{K2/20}$;

and $$G(T) = 10^{A/20} \left[ \frac{E(T)}{10^{K2/20}} \right]^{(R2-1)}$$

for $E(T) > 10^{K2/20}$.

These gain equations are implemented in the programming for the digital signal processor, as described below.

Figure 6:
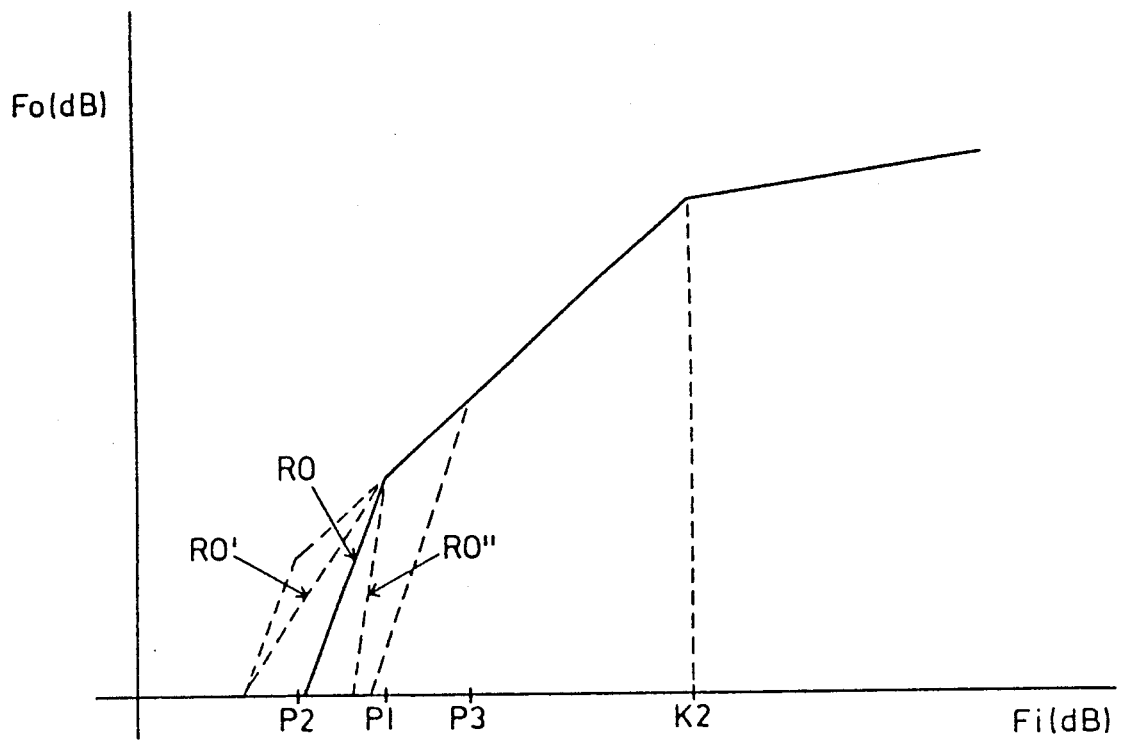
FIG. 6 is a graph similar to that of FIG. 4 showing the effect of a change in the lower knee level as a result of changes in the background noise level in the signal.

To best adapt to changing noise and signal levels, the positions of the knees K1 and K2 in FIG. 4, as well as the slopes of the piecewise linear segments, can be varied as a function of the various estimates of signal and noise taken from the energy envelope estimate E(T). With reference to FIG. 6, the position of the first knee may be changed smoothly from positions P1 to P2 to P3 depending on the level of noise to best suppress the noise, on the assumption that the noise is lower than the speech level. The position of the lower expansion knee changes with a noise estimate NX(T). Preferably, this noise estimate changes very slowly, so that it can be thought of as a fixed knee which changes as the background noise level changes. In the preferred embodiment of the present invention, the knee K1 is placed at a fixed height (e.g., about 15 dB) above the noise estimate. Provided that the speech to noise ratio is better than 15 dB, the speech peaks will be unaffected and so the perceived loudness of the speech is not changed. However, as the position of the knee moves outwardly from, for example, a nominal level of P1 to P3 as the noise level increases, the noise will be within the expansion portion of the piecewise linear curve which will reduce the noise by up to 15 dB. As noise decreases, the knee may drop from the nominal level to a lower level P2 to enhance the lower level speech signals. Preferably, the expansion knee level will be selected so that only a small amount of the speech signal falls in the range below the expansion knee to minimize distortion of the speech. The position of the knee with respect to the noise level can be set individually for a user if he or she requires more noise suppression or can tolerate less speech distortion. The position of the second knee K2 remains fixed, as do the slopes of the gain function segments.

Alternatively or in addition to changing the position of the knee K1, the slope of the expansion section below K1 can be changed to minimize noise. For example, the slope of this section (and thus the expansion ratio) can change in direct relation to the noise level estimate to suppress the effective noise level, e.g., from R0 to R0' to R0''.

Figure 7:
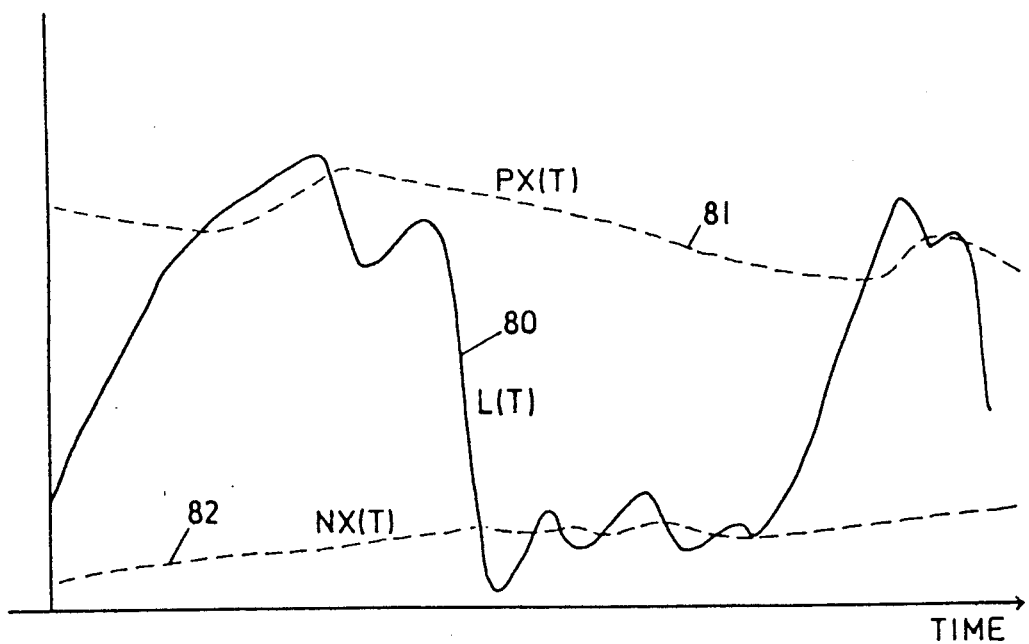
FIG. 7 is a graph illustrating the changes in the amplitude envelope (or signal energy) of a typical signal within a specified frequency range and the manner in which the noise and peak levels of the signal are estimated.

FIG. 7 illustrates the preferred manner in which the estimates NX(T) and PX(T) of noise and peak levels are obtained for each one of the five frequency bands. The log energy, L(t), in the band is calculated. Then, as shown in FIG. 7, L(t) is used to update running estimates of the peak and noise levels. As the log energy (graph 80 in FIG. 7) changes in level, the peak level estimator, indicated by the graph 81, and the noise level estimator, indicated by the graph 82, slowly change. Preferably the noise estimate tracks about the eleventh percentile of the distribution of the (or, equivalently, the distribution of the energy envelope) log spectrum energy envelope values and the peak estimate tracks about the eighty-ninth percentile. The rates of change are slow enough to track the noise level in pauses in speech and the speech peaks, without significant modulation caused by pauses in continuous speech.

Figure 8:
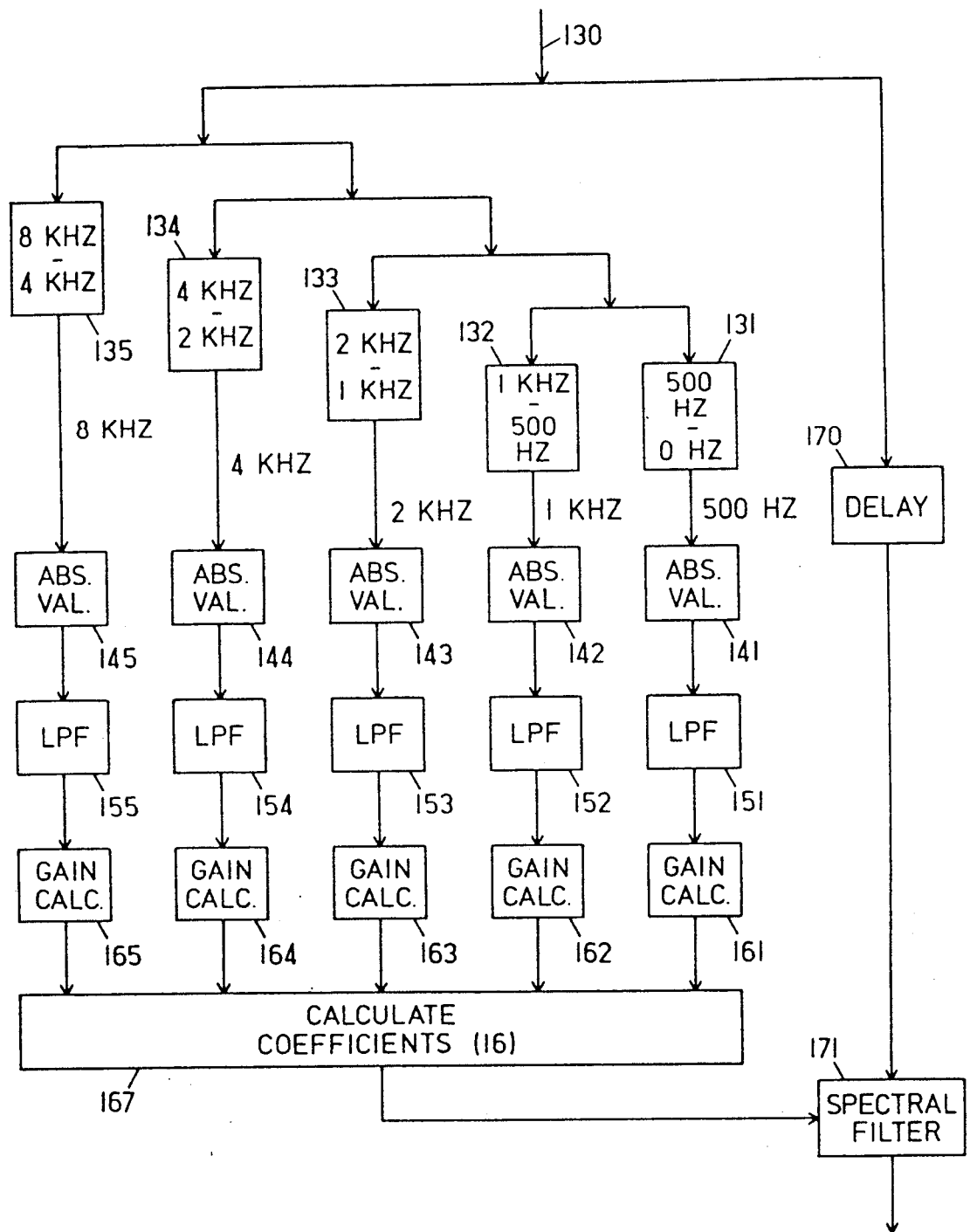
FIG. 8 is a schematic block diagram showing an implementation for the time varying spectral filter function in accordance with the present invention.

A block diagram of the time varying filter implementation of the digital signal processing of the present invention is shown in FIG. 8. The input signal (represented as samples coming in at 130 in FIG. 8) is directed to a filter bank composed of octave filters 131-135 which separate the signal into several frequency bands from, e.g., 0 to 500 Hz, 500 Hz to 1 kHz to 2 kHz, 2 kHz to 4 kHz, and 4 kHz to 8 kHz. An absolute value is taken of the output of each of these filters in absolute value functions 141 to 145, respectively, and these absolute value sequences are smoothed by low pass filters 151-155, respectively. Gain calculations are made for each band in gain calculation functions 161 to 165, respectively. Based on the gain calculations the filter coefficients are calculated (e.g., 16 coefficients in total) at 167. The input samples are also provided to a delay circuit 170 which compensates for the delay going through the filtering sections and provides an output signal to a (e.g., 31-long) filter 171, coefficients of which have been calculated in the function 167.

The noise suppression gain functions are calculated at 161 to 165 for each of several separate frequency bands. If the noise level varies across the frequency spectrum, then noise reduction can be used in only those bands where it is needed. Thus, bands which are relatively noise free need not be distorted.

Figure 10:
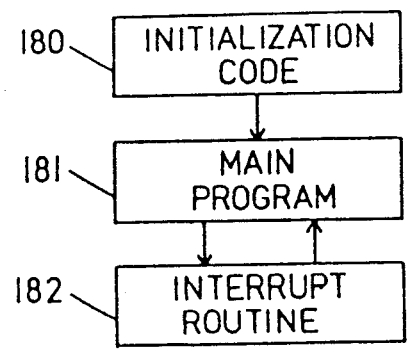
FIG. 10 is a flow chart showing the program blocks in the programming of the digital signal processor which carry out the time varying filter processing of FIG. 8.

The algorithm for the time varying spectral filter has three main program blocks, as shown in FIG. 10, an initialization code (block 180), a main program (block 181) and an interrupt routine (block 182). The initialization code sets any constants which are needed in the other routines and does any initialization of input/output ports which is needed. The main program uses energy estimates xal(1) through xal(5) from the interrupt routine and calculates the time varying coefficients coef(0) through coef(15) for the filter. The energy estimates are also used to track a peak and a noise level estimate for each of the channels. The user switches are checked in the main program loop, and if they have changed, the appropriate parameters are reset. The interrupt routine is executed once for each input sample. It determines the energy estimates xal(1) through xal(5) and filters the signal with the 31-tap filter.

Figure 11:
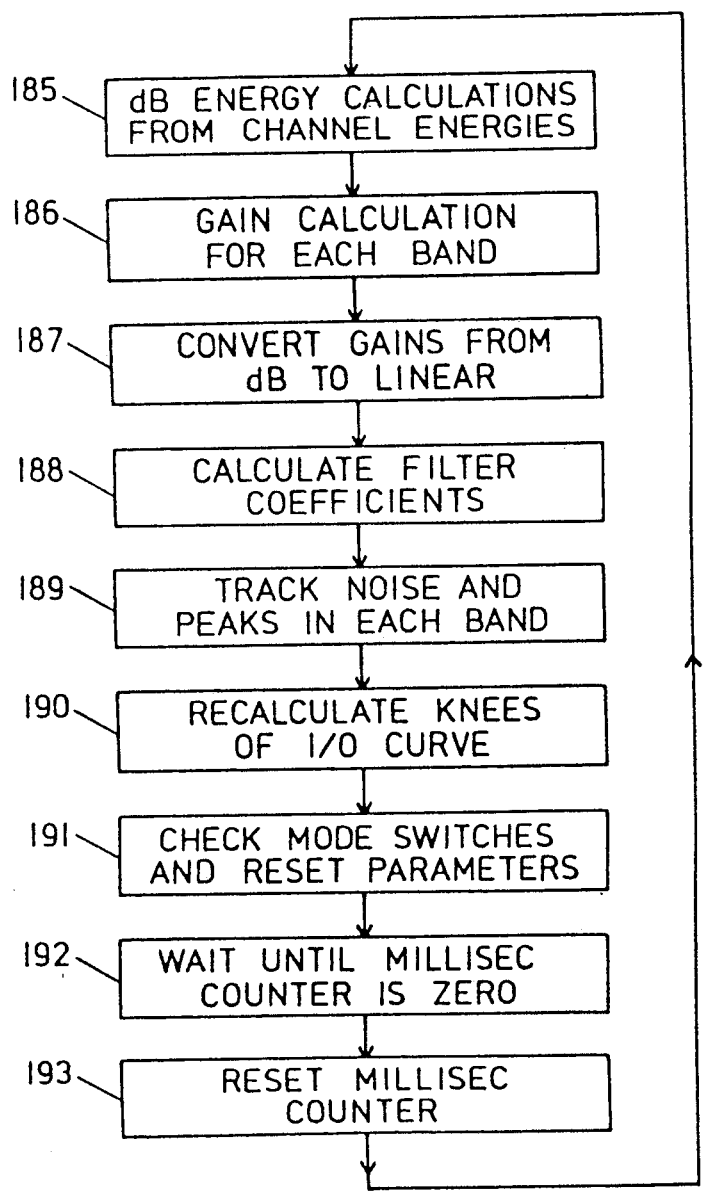
FIG. 11 is a flow chart showing the main program portion of the, processing system of FIG. 10.

The main program shown in FIG. 11 begins with dB energy calculation (block 185) from channel energy estimates xal(1) through xal(5). This provides a conversion from a magnitude scale (the output of the octave band filter network in the interrupt code) to a logarithmic decibel scale. Preferably, the program computes the exponent and then uses a look-up table for the mantissa for computational efficiency. The calculation for the approximation of the logarithm is thus effectively carried out as follows:

$$loglev(i) := 16*log2(xal(i)), \text{ for } i = 1 \text{ thru } 5$$

The foregoing expression and other expressions herein that correspond to software operation and written using conventional coding symbols. For example, the symbol "*" implies multiplication of the two factors which it separates, and the symbol "**" implies that the first factor separated by the symbol is raised to the power of the second factor. Log2 implies the logarithm to the base 2 of the factor that follows. Such symbols are convention and readily understood.

The gain is then calculated for each band from the input/output function (block 186). The gain calculation is replicated five times, once for each of the channels. The gain function can have several possible forms. A preferred form is an expansion with ratio rat0 below the knee K1, linear between knee K1 and a second knee K2, and compression with a ratio rat2 above knee K2. The calculated gain thus is:

$$loggain(i) := (loglev(i) - knee2) * (rat2 - 1) \text{ if } K2 < loglev(i)$$

$$loggain(i) := 0$$

if $K1 \leq loglev(i) \leq K2$ $$loggain(i) := (loglev(i) - K1) * (rat0 - 1) \text{ if } loglev(i) < K1$$

Suitable preferred values for rat0 and rat2 are 2.0 and 0.3, respectively, giving an expansion of 1:2 and a compression of 3.3:1. Other values are possible, providing a tradeoff between the amount of distortion which is acceptable for the user and the degree of compression that would be suitable. The values of K1 and K2 can be fixed or either or both can depend upon the current estimated signal and noise levels. When K2 is fixed, it is preferred to set it at a value corresponding to speech peaks. When K1 is fixed it is based on the user preference in the fitting procedure. Again, other forms of input/output function are possible, including piecewise linear functions having more knees to divide the range into a number of segments with different expansion or compression ratios. In this way, any shape of input/output curve can be approximated by a piecewise linear function.

The gains are then converted from dB to linear (block 187). First, the user prescription gains, fgain(i), are added for each band and then the gains are converted from a log scale to a linear scale by using a look-up table and the results are stored as array gmul(i) for the calculation of coefficients:

$$gmul(i):=2^{**}((fgain(i)+loggain(i))/16) \text{ for } i=1 \text{ through } 5$$

The filter coefficients are then calculated (block 188). The same coefficients may be used as in the octave band filter network described further below. Because of the simple form of the filters, the coefficients can be calculated efficiently as follows:

$gx(5):=(gmul(5)-gmul(4))/256$
$gx(4):=(gx(5)+(gmul(4)-gmul(3))/64$
$gx(3):=gx(4)+(gmul(3)-gmul(2))/16$
$gx(2):=gx(3)+(gmul(2)-gmul(1))/4$
$gx(1):=gx(2)+gmul(1)$
$coef(0):=gx(5)$
$coef(1):=coef(0)+gx(5)$
$coef(2):=coef(1)+gx(5)$
$coef(3):=coef(2)+gx(5)$
$coef(4):=coef(3)+gx(5)$
$coef(5):=coef(4)+gx(5)$
$coef(6):=coef(5)+gx(5)$
$coef(7):=coef(6)+gx(5)$
$coef(8):=coef(7)+gx(4)$
$coef(9):=coef(8)+gx(4)$
$coef(10):=coef(9)+gx(4)$
$coef(11):=coef(10)+gx(4)$
$coef(12):=coef(11)+gx(3)$
$coef(13):=coef(12)+gx(3)$
$coef(14):=coef(13)+gx(2)$
$coef(15):=coef(14)+gx(1)$ The apparent way to calculate such coefficients would require 87 multiplies and accumulates whereas the foregoing procedure requires only 23 additions. Although the time saving achieved in the main program is not as important as in the interrupt code, because the main program is executed only once during the time period when the interrupt is executed several times, a worthwhile savings in computation time is still obtained.

The program next tracks peak and noise levels (block 189). Estimates of the peak and nosie level are made according to the formulas:

$peak(i):=peak(i)+pu \text{ if } loglev(i)>peak(i)$
$peak(i):=peak(i)-pd \text{ if } loglev(i)<peak(i)$
$noise(i):=noise(i)+nu \text{ if } loglev(i)>noise(i)$
$noise(i):=noise(i)-nd \text{ if } loglev(i)<noise(i)$
for $i=1$ thru 5

It does not matter which formula is performed when $loglev(i)=peak(i)$ or $loglev(i)=noise(i)$. In a steady state case, peak and noise will settle down to some percentile of the distribution of the loglev values. Which percentile, and how fast the estimates will react to a change in level is determined by the values of pu, pd, nu, and nd. Preferred values are such that pu and nd correspond to 80 dB/per sec and pd and nu correspond to 10 dB per sec. This makes the noise estimate track the 11th percentile of the loglev values and the peak estimate track the 89th percentile. The rates are slow enough to track the noise level in pauses in speech and the speech peaks without much modulation caused by pauses in continuous speech.

The program then recalculates knees of the input/output curve (block 190). The knees, K1 and K2, can be fixed or can depend upon the estimated peak and noise levels. One preferred embodiment is either to have both fixed or else just K1 variable. In the variable case the formula is:

$$K1(i):=noise(i)+nsplus$$

for $i=1$ thru 5 with the value of K1(i) limited to lie in a range K1min to K1max. The min and max are set by user preference during the fitting procedure. nsplus is how high above the noise level to place K1(i). A value corresponding to 15 dB is preferred, based on testing in a variety of noise environments.

Mode switches and reset parameters are then checked (block 191). The switches are checked to see whether they have been pressed and, if they have, the parameters corresponding to that switch are read and replace those parameters in the algorithm. Examples of parameters which can be reset are:

| | |
|---|---|
| K2 | higher knee of input/output curve |
| K1min | min value for lower knee |
| K1max | max value for lower knee |
| rat0 | expansion/compression ratio below K1 |
| rat2 | expansion/compression ratio above K2 |
| fgain(i) | gains for the 5 bands |
| nsplus | the level above noise to place K1 |

The program then waits until the millisec counter is less than or equal to zero (block 192). The counter is decremented in the interrupt routine. When the millisec counter is zero the counter is reset to a positive number (block 193). The number governs how often the main program is executed. Preferably, the main program is executed about once every millisecond.

Figure 12:
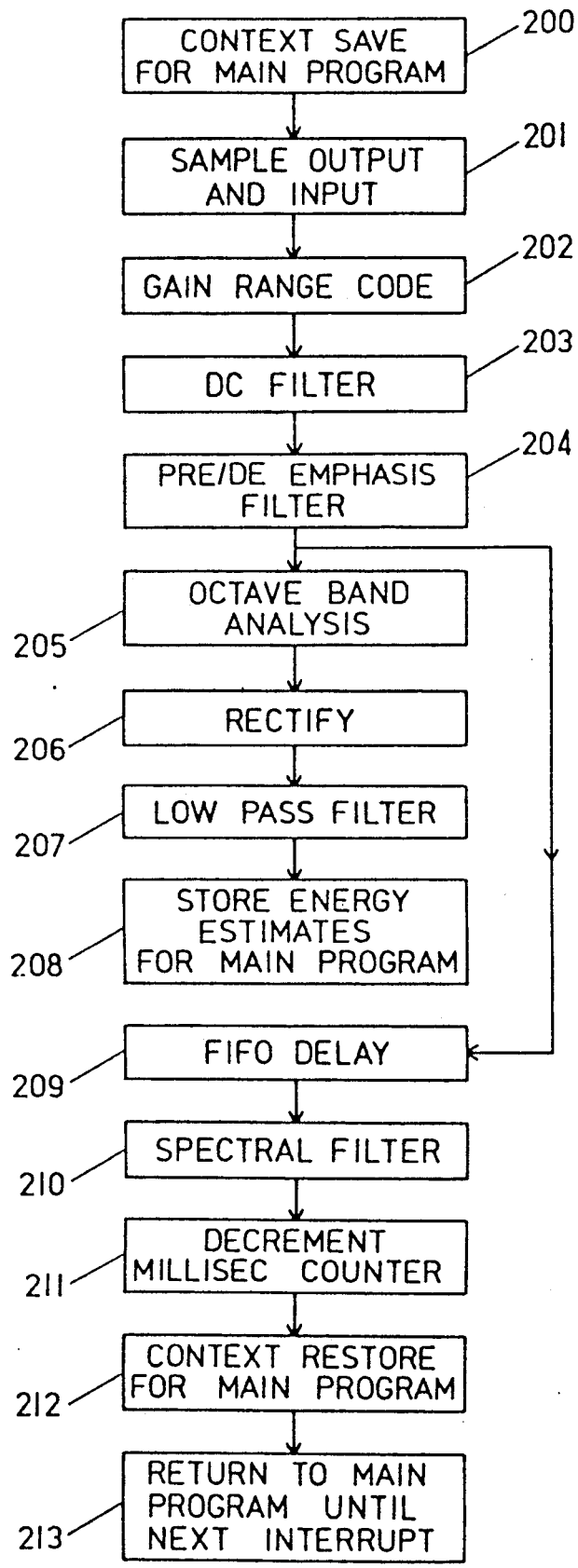
FIG. 12 is a flow chart showing the interrupt routine program of the processing system of FIG. 10.
Figure 13:
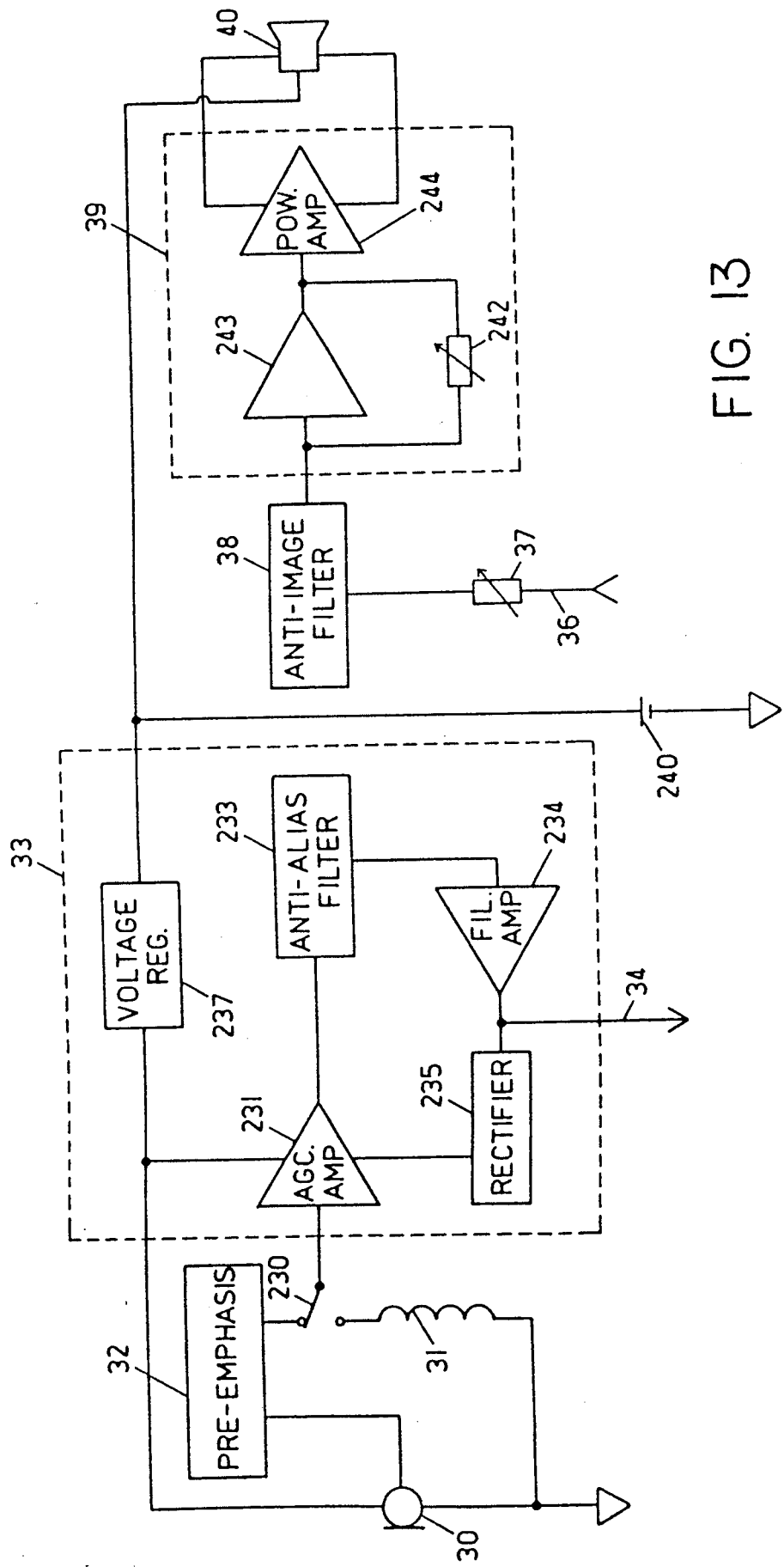
FIG. 13 is a schematic block diagram showing the hardware components of the ear piece portion of the hearing aid system of the present invention.

A flow diagram for the interrupt routine is shown in FIG. 12. The routine begins with context save for the main program (block 200). The current program counter, registers and processor status are stored, as is usual in an interrupt routine. Next, a sample input and a sample output are obtained and provided, respectively (block 201); the output sample x5(t) is sent to the digital to analog converter and the input sample x0(t) is read from the analog to digital converter.

The Gain Ranging Code is then executed (block 202). The input level is adjusted, depending upon the current setting of the attenuator (block 45 in FIG. 2). This is done so that the original signal level is restored, as:

$x1(t):=x0(t)*rmul,$ where the attenuator has attenuated by a factor which is the inverse of rmul. Also, the attenuator setting may be adjusted. If the incoming sample x0(t) is greater than half full scale, then the attenuation for subsequent samples is increased by 6 dB. If the samples have all been below quarter full scale for the last 32 samples, then the attenuation is decreased by 6 dB. By these means, the signal level is kept within the range of the A/D converter, with sufficient resolution to give a low quantization noise floor.

A high-pass filter operation is then optionally performed to remove DC offsets (block 203). Output x2(t) from the filter is a high-pass filtered version of the input x1(t). The filter is optional and has a preferred high-pass break point frequency of about 100 Hz. An exemplary formula for implementing this is:

$x2(t):=x1(t)-dc$ $dc:=dc+x2(t)/16$

If the filter is, optionally, not implemented, then x2(t):=x1(t).

A pre/de emphasis filter is then optionally provided (block 204). There are three options for the filter, which has input x2(t) and output x3(t). The options are pre-emphasis, flat, and de-emphasis. Pre-emphasis is flat to about 1 kHz and rises at 6 dB per octave above that. De-emphasis is flat to about 1 kHz and falls at 6 dB per octave above that. The choice between the filters is made on the basis of the general shape of the user's audiogram. The possible options can be implemented as:

x3(t): = x3(t − 1)*7/8 + x2(t)*1/2 for de-emphasis x3(t): = x2(t) for flat x3(t): = x2(t)*2 − x2(t − 1)*7/4 for pre-emphasis The octave band analysis is then carried out (block 205). This code implements 5 finite-impulse-response (FIR) bandpass filters which are spaced at octave bands. The filters can be thought of as being specified by a weighted sum of samples, but with the preferred way of implementing them saving a considerable amount of computation. The simplest implementation would need 87 multiplies and accumulates per input sample, whereas the preferred implementation needs no multiply and just 5 adds per input sample. The basic procedure, as described generally above, is to separate the incoming signal into two channels by a simple pair of low-pass and high-pass filters. Each one of this pair of channels has half the bandwidth of the original channel, allowing the program to halve their sampling rates. Then the lower channel can be again halved in exactly the same way. This process can be repeated as many times as desired. For example, this can be done 4 times to produce 5 filters (0–500 Hz, 500 Hz–1 kHz, 1 kHz–2 kHz, 2 kHz–4 kHz, 4 kHz–8 kHz). This filter breakdown matches reasonably well with the resolution needed for a speech signal. In the present invention the output of the bandpass filter network is only used to calculate the coefficients for a filter which acts directly on the full bandwidth signal path. This avoids all the channel aliasing problems encountered in multi-channel filters and allows the use of very simple filters and a slow output rate for each of the filters. This makes the algorithm very computationally efficient. For the lower frequency channels, the full sampling rate is not needed.

The simple component filters lend themselves to a simple implementation. Because of the multi-stage down-sampling, different formulas must be executed depending on the current sample number. The timing all depends on powers of two, so the exemplary code for the digital signal processor program set out below uses a variable called 'clock' which is incremented for each incoming sample, and the bits of the variable are tested to check which formulas to execute.

```
clock=clock+1;
  if (clock & 1)
  (
    vo=sample;
    vpo=vo+ve;
    temp=abs(vpo+vpe−4*ve);
    vlp=vlp+(temp-vlp)/8;
  else if (clock & 2)
  (
    ve=sample;
    vpe=ve+vo;
    wo=vpe+vpo;
    wpo=we+wo;
    temp=abs(wpo+wpe−4*we);
    wlp=wlp+(temp-wlp)/8;
  else if (clock & 4)
  (
    ve=sample;
    vpe=ve+vo;
    we=vpe+vpo;
    wpe=we+wo;
    xo=wpe+wpo;
    xpo=xe+xo;
    temp=abs(xpo+xpe−4*xe);
    xlp=xlp+(temp-xlp)/8;
  else if (clock & 8)
  (
    ve=sample;
    vpe=ve+vo;
    we=vpe+vpo;
    wpe=we+wo;
    xe=wpe+wpo;
    xpe=xe+xo;
    yo=xpe+xpo;
    ypo=ye+yo;
    temp=abs(ypo+ype−4*ye);
    ylp=ylp+(temp-ylp/8;
  )
  else
    ve=sample;
    vpe=ve+vo;
    we=vpe+vpo;
    wpe=we+wo;
    xe=wpe+wpo;
    xpe=xe+xo;
    ye=xpe+xpo;
    ype=ye+yo;
    temp=abs(ypo+ype);
    zlp=zlp+(temp-zlp)8;
```

The number of operations needed in the energy analysis network is very small because so much of the filtering is done on streams which have been decimated to successively slower rates. Also, unlike the Fast Fourier Transform or most filter banks, the network needs only additions and no multiplications. The low pass filter (filters 151 to 155 in FIG. 8) in the subsequent rectify and low pass filter operation requires a division by a constant, but this can very easily be implemented by a shift, using either a hardware or a software implementation.

At each sample time there are two parts to the computation, the decimated filtering followed by the rectify and low-pass filter operation. The second of these needs a constant amount of computation per sample: two adds, two subtracts, two shifts, and an absolute value operation. The decimated filtering needs between 1 and 2*N−1 adds, where the filter bank goes through N levels (e.g., N=5 for the filter of FIGS. 8 and 9). The deeper levels of filtering are those which take more computation, but they are also calculated less frequently. On average, less than three adds are needed per sample. Interestingly, this is independent of how many octave bands are needed. As the number of bands becomes large, the average number of adds approaches the limit of 3. With such small numbers of arithmetic operations, the control logic becomes significant. As the code is written above, there are on average 2 bit-test and conditional branches per sample.

The rectify stage (block 206) is an absolute value, xa(i), of xf(i). There are 5 channels, but only one value of xa(i) is produced at each time, so this block and the low pass filter block are only executed for that output:

$$xa(i):=abs(xf(i))$$

A square could also be used for a slightly more accurate estimate of the root-mean-square signal level, if desired.

A low pass filter (block 207) then acts on xa(i) to give output xal(i). Several different low-pass filters are possible, but a preferred embodiment uses a single-pole low pass filter with a cut-off frequency of 1 kHz:

$$xal(i)=xal(i)+(xa(i)-xal(i))/tc$$

where tc is a time constant, measured in samples. Preferred values for tc are in the range of 8 to 16.

The energy estimates xal(i) are then stored for use by the main program loop (block 208). The output of the pre/de-emphasis filter is provided in the main signal channel to a first-in-first-out delay (block 209). The signal x3(t) is delayed by a first-in-first-out queue to give output x4(t). The delay balances the delay in the low-pass filter, so that changes in signal level do not happen before the compression or expansion can occur.

$$x4(t):=x3(t-4*tc)$$

Where tc is the same time constant used in the rectify-low-pass-filter. The delay cannot be perfectly balanced because there are different delays in the several bands. Thus, an average delay corresponding to the middle channel is chosen.

The delayed signal x4(t) is then provided to the spectral filter, which may be implemented as a finite impulse response filter (block 210). The spectral filter provides both shaping of the gain spectrum and the non-linear amplifier gain for each channel. The coefficients are calculated in the main program and are used here.

$$x5(t):=sum\ over\ i(x4(t-i)*coef(i))$$

$$for\ i=0...31$$

The filter is symmetrical (coef(31−i)=coef(i)), so only the sixteen coefficients calculated in the main program are needed here.

The millisecond counter is then decremented (block 211): counter:=counter−1 and context is restored for the main program (block 212), wherein registers and processor status are restored for main program execution. The program counter is restored to the value at the start of the interrupt. The main program is then restarted (block 213).

Feedback is a common and annoying phenomenon in hearing aids. The wearer usually hears it as a loud, high frequency squeal when he moves close to a sound-reflecting surface, such as a wall, or when he turns up the volume knob to a high setting. The feedback instability in a hearing aid has the same causes as feedback in a public address system. A sound comes into the microphone of the hearing aid, is amplified and sent out by the receiver. It then leaks back to the microphone and starts around the loop again. If the loop gain of the system (hearing aid plus acoustic feedback path) is greater than or equal to unity and the phase is a multiple of 360° at any frequency, then the output at that frequency will quickly rise in amplitude until it reaches the maximum output level for the aid.

The simplest way to stop feedback in a hearing aid is to reduce the gain of the aid. If it is reduced sufficiently so that the gain around the loop is less than unity at all frequencies there will be no feedback instability. But the main purpose of hearing aids is to provide gain, so reducing the gain may not be a good solution for many people who have moderate to severe hearing losses. The other way to prevent feedback is to reduce the gain in the acoustic feedback path, between the receiver and the microphone. This can be done physically by using a tight fitting ear-mold without a vent-hole. The disadvantage is that tight fitting ear-molds can be uncomfortable and the use of a vent-hole may be necessary to give a desired frequency shaping.

Acoustic feedback in a digital hearing aid arises from exactly the same causes as in a conventional analog aid with the slight difference is that digital aids tend to introduce a small delay to the signal. An analog aid will have a delay of the order of 100 microseconds whereas a digital aid may have a delay of perhaps 5 milliseconds. This causes no perceptual problems and it does not change whether or not feedback occurs, but it will change the rate at which instability climbs to the maximum level. Longer delays will cause a slower climb, although it may still be perceptually fairly fast. Preferred auxilliary digital signal processing which may be performed on the signal path in the digital signal processor to reduce feedback is described below.

The feedback transfer function around a hearing aid comprises a gain and a phase at each frequency. The feedback can be disrupted either by reducing the gain or by changing the phase relationships. The phase relationship can be changed by including a variable delay line in the main signal path. As the delay changes, so does the phase. An equation for implementing this delay function in the main signal processing path performed by the digital signal processor 50 is as follows:

$$y(t):=x(t-d)$$

where y(t) is the output signal of the delay function, x(t) is the input signal to the delay function, and d changes slowly in time from 0 to D and back again periodically with a constant period. It increases by 1 every dn'th sample until it reached D and then reverses direction and decreases at the same rate until it reaches 0, where it reverses direction again.

The choice of D and dn is a trade-off between feedback reduction and distortion of the signal. Large values for the two constants give more reduction and more distortion. The distortion sound has a warbling quality to it. Reasonable values are D=8 and dn=32, which result in acceptable level of distortion.

Figure 14:
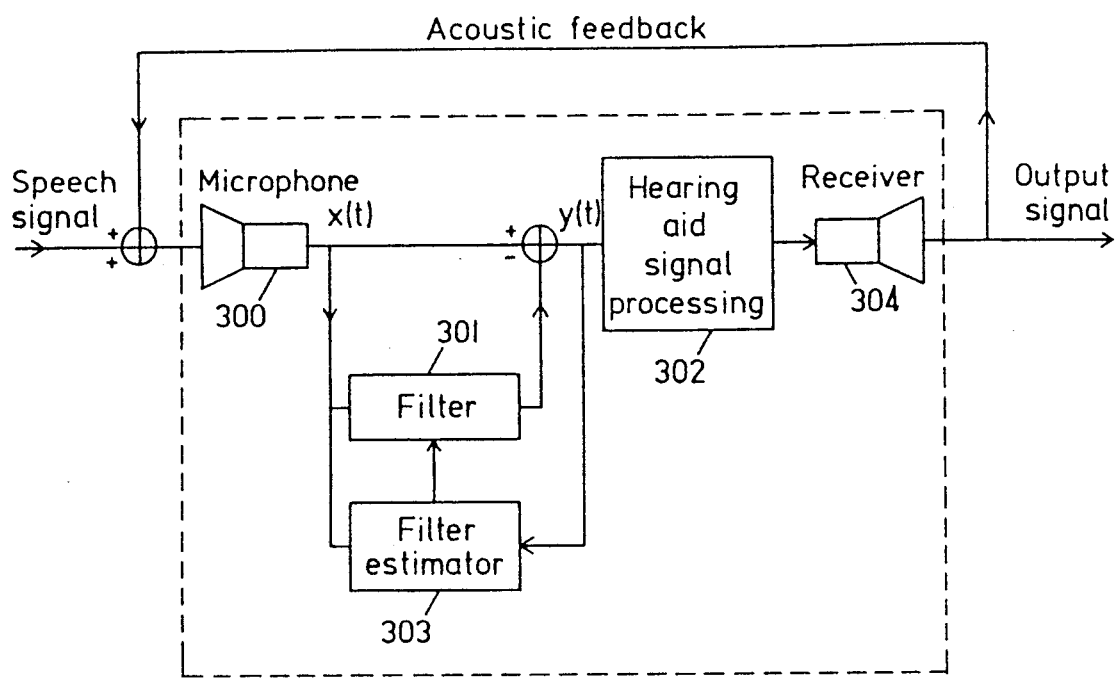
FIG. 14 is a schematic block diagram showing one of adaptive suppression of acoustic feedback.

A second signal process for reducing feedback looks at the incoming signal and checks whether there are any strong tonal components. Feedback usually occurs at specific frequencies and is heard as a loud tone or whistle. If strong tones are present, they are attenuated in the digital signal processor 50 by means of an inverse filter. This is done by the technique of linear prediction. As shown schematically in FIG. 14, the incoming signal x(t) from the microphone 300 may be filtered by a slowly time-varying filter 301, and the filtered signal is subtracted from x(t) to yield an output signal y(t) which is provided to the remaining main signal processing path 302. The output of the digital filter 301 is an optimal estimate of the current input sample based on past input samples. Given speech input, the inverse filter will provide a mild high-frequency emphasis; however, when feedback (tonal) components are in the input signal, the inverse filter, under control of a filter estimator 303, will provide a notch filter centered at the frequency of the feedback signal. The inverse filter is adaptive, being updated each sample as a function of the input signal. It is understood that the signal processing blocks illustrated in FIG. 14 are carried out within the digital signal processor 50 of FIG. 2.

The program equations executed for these functions are as follows:

$$y(t) := x(t) - \text{sum over } n \, (c(n)*x(t-n))$$

for $n = 1$ thru $N$ $$c(n) := c(n) + B * y(t) * x(t-n)$$

for $n = 1$ thru $N$ $$B := BT/(R0 + BC)$$

R0 is an estimate of the mean square energy in the input signal and BC and BT are constants. R0 can be implemented as follows:

$$R0 := R0 + (x(t)*x(t) - R0)*RT$$

where RT is a constant.

The first equation is a filter whose coefficients c(n) vary slowly and are calculated by the other equations. The constants BT and RT determine how fast the algorithm adapts to changing signals. The more important of these two is BT. A value of about $2^{-12}$ is preferred, giving a time constant of about 250 milliseconds. The preferred value for RT is about $2^{-11}$, for a time constant of 150 milliseconds. This governs the length of time over which the short term energy estimate R0 is made. The constant BC helps to slow down the adaptation during periods of low signal and is set to a value of $2^{18}$. The parameter B changes slowly. Thus, it is not necessary to update B every sample. The preferred update rate which minimizes computation without compromising performance is to compute B once every 512 samples.

The number, N, of coefficients can have a value of 2 or more. The more coefficients there are, the greater is the amount of computational power needed in the algorithm. A large number of coefficients would give the possibility of eliminating several tones from the signal. But a small number of coefficients gives less distortion. Values of 2 to 6 are preferred.

Figure 15:
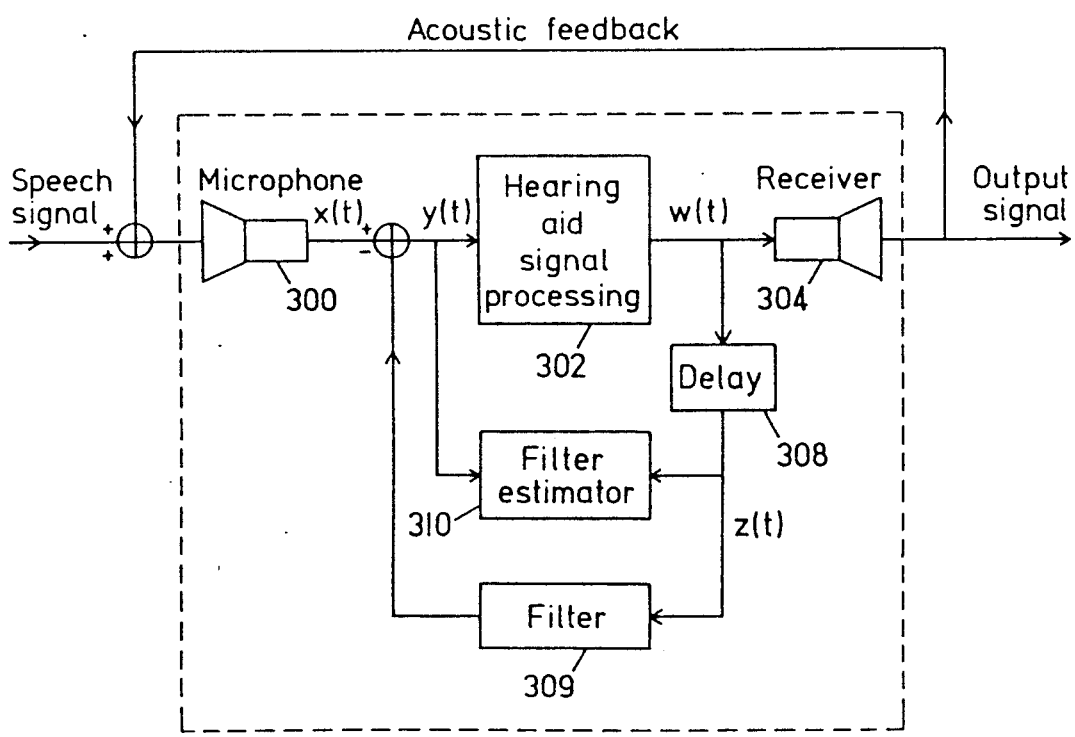
FIG. 15 is a schematic block diagram showing another form of adaptive suppression of acoustic feedback.

In a third process, the input and output signals of the hearing aid are analyzed and the transfer function around the acoustic feedback path is estimated. The transfer function is used to form an estimate of the acoustic feedback signal which is then subtracted or cancelled from the input signal, as illustrated schematically in FIG. 15. This method models the hearing aid input from the microphone 300, x(t), as the sum of a desired input signal (e.g. speech) and a noise signal, the acoustic feedback signal. The acoustic feedback signal estimate is obtained by filtering the main signal processing path output, w(t), (a delayed and processed version of the input) with the estimate of the acoustic feedback path transfer function. The transfer function of the acoustic feedback is modeled as a pure delay function 308 (to compensate for the time it takes for the acoustic signal to travel from the hearing aid output to the microphone input) and a linear filter 309 (to compensate for the frequency shaping imposed by the acoustic environment), with both functions in a feedback path from the output to the input of the main signal processing path. A filter estimator 310 uses the input signal y(t) and the output signal w(t) for the delayed output signal z(t) to determine the coefficients of the filter 309. The preferred value of the delay is 12 samples, given a 14 kHz sampling rate. However, this value may be fit to each individual situation if necessary. The filter transfer function estimate is updated each sample as per the following equations:

$$y(t) := x(t) - \text{sum over } n \, (c(n)*z(t-n+1))$$

for $n = 1$ thru $N$ $$c(n) := c(n) + B * y(t) * z(t-n+1)$$

for $n = 1$ thru $N$ $$B := BT/(R0 + BC)$$

where BT and BC are constants and the energy estimate R0 may be implemented as:

$$R0 := R0 + (x(t)*x(t) - R0)*RT$$

where RT is a constant

The input signal to the digital signal processor from the microphone (after A to D conversion) is x(t). The feedback function is executed to form y(t). Then further processing in the main signal processing path 302, for example, frequency shaping or noise reduction as described above, produces the final output w(t). A delayed version of the output, z(t) is filtered to yield the feedback signal estimate which is subtracted from the input, x(t).

The first equation above is a filter whose coefficients c(n) vary slowly and are calculated by the other equations. The constants BT and RT determine how fast the algorithm adapts to changing signals. The more important of these two is BT. A value of about $2^{-11}$ is preferred, giving a time constant of about 150 milliseconds. The preferred value for RT is about $2^{-5}$, for a time constant of about 2.5 milliseconds. This governs the length of time over which the short term energy estimate R0 is made. The constant BC helps to slow down the adaptation during periods of low signal and is set to a value of $2^{25}$. To save computation, the variable B need not be recalculated at each sample interval. B changes slowly and it is sufficient to calculate it once every 512 samples.

The number, N, of coefficients can have any value. The more coefficients there are, the greater is the amount of computational power needed in the algorithm. A large number of coefficients gives a better possibility of modeling the feedback path accurately, but a small number of coefficients has less effect on the speech signal. Also, larger numbers of coefficients can cause problems with numerical accuracy. Given these conflicting requirements, values of 6 to 12 for N are preferable.

In the digital processing of many types of signals, the dynamic range requirement is much greater than the signal to (quantization) noise ratio requirement. Audio signals, both speech and music, are examples of such signals. An efficient, low power, low voltage data conversion system is preferred which is applicable to signals having bandwidths below about 20 kHz, particularly a digital signal processing system for the hearing impaired where approximately a 72 dB input dynamic range is required.

A conversion system which requires significantly less circuit power and circuit complexity to implement than traditional data converters with comparable dynamic range is shown in FIG. 2 composed of the gain ranging amplifier 45, the 30 dB gain amplifier 46 and the 8 bit linear analog to digital converter 47. These units operate under the control of the digital signal processor 50 through the control and timing logic 51. In the processing of speech dominated audio signals the rate at which large signal changes take place is relatively slow, and the gain ranging amplifier 45 can be utilized to extend the dynamic range of the (e.g., 8 bit) analog to digital converter 47. As long as the rate at which large signal changes take place is below the rate of change for the gain of the gain ranging amplifier, such an approach can be utilized. In such speech audio applications, it is found that the gain change rates can be limited to 6 dB per 150 microseconds for gain decreases and 6 dB per 150 milliseconds for gain increases and still provide the necessary dynamic range and signal to noise ratio. Generally 8 bits of linear analog to digital conversion capability are required for such an approach.

The gain control algorithm used to control the gain ranging amplifier (or digital attenuator) 45 operates such that if the magnitude of the digital sample from the 8-bit linear analog to digital converter 47 exceeds $2^6$ (64) for any sample, then the gain of the gain ranging amplifier 45 will be reduced by a factor of 2 by the digital signal processor 50. Conversely, if the sample magnitude is less than $2^5$ (32) for one millisecond, then the gain of the amplifier 45 will be increased by a factor of two. This computation is carried out by the digital signal processor in the Gain Range Code block 112 in the single band algorithm interrupt routine and in the Gain Range Code block 202 in the time varying filter algorithm interrupt routine.

A somewhat more detailed block diagram of the ear piece circuit portion of the hearing aid is shown in FIG. 14. A switch 230 allows the input to be taken either from the microphone 30 through the pre-emphasis circuit 232 or from the telecoil 31. The input signal goes into the circuit 33 which includes an automatic gain control amplifier 231, the output of which is received by the low pass anti-aliasing filter 233. The output of the filter 233 is passed through a filter amplifier 234 and is provided on the line 34 to the digital signal processing components in the processor unit. The output of the filter 234 is also provided to a rectifier 235 which feeds back to the AGC amplifier 231 to control its output level. The AGC amplifier receives its power (as does the microphone 30) from a voltage regulator 237 which is supplied from a low voltage battery source 240 in the ear piece.

The signal on the lines 36 from the pocket processor portion of the hearing aid is received in the ear piece and passed through an adjustable attenuator 37 which is adjusted by the hearing aid fitter, and thence the signal passes through the anti-imaging filter 38 to the power amplifier section 39 which drives the receiver speaker 40. The power amplifier section 39 is supplied directly with power from the voltage source 240 and includes a voltage adjustment 242 operated by the dial 28 which controls the gain of an amplifier 243 which, in turn, supplies the power amplifier 244.

As noted above, the hearing aid preferably can be programmed to adapt to the hearing deficit of a particular user. The fitting procedure determines the values of several parameters of the hearing aid algorithm. The patient's hearing may first be tested by standard audiological methods to determine thresholds and other standard parameters. The individual being tested may then be supplied with a master hearing aid which is a computer based processor running the same algorithms as the hearing aid. The patient goes through a protocol in which speech (sometimes with noise added) is provided to him or her. The master hearing aid processor then executes the hearing aid algorithms and switches between different sets of parameters. The patient then indicates his or her preference (or the subjective intelligibility) of the signal by pressing buttons on the master hearing aid. The information from the buttons is stored back into the computer. Several possible procedures may be utilized to take a set of parameters so determined and reach an optimal set by making small changes and paired comparisons. One such procedure is the simplicial method.

The fitting is preferably done in both quiet conditions and with noise added to the speech. The patient may well require different parameter sets under these different conditions. The three positions of the selection switch on the hearing aid allows up to three different sets of parameters to be provided for normal use. During execution of the code by the digital signal processor in the hearing aid, the switches are checked to determine whether they have been pressed, and if they have, the parameters corresponding to the switch that is pressed are read and replace those parameters previously in the algorithm. As noted above, among the parameters which preferably can be read and changed for each position of the mode switches are K2, the higher position of the higher knee of the input-output curve; K1min, the minimum value for the lower knee position; K1max, the maximum value for the lower knee; rat0, the expansion/compression ratio below the knee K1; rat2, the expansion/compression ratio above the knee K2; Wgains, the gains in the five bands which form the shaping filter; and nsplus, the level above the noise to place the knee K1.

It is understood that the invention is not confined to the particular embodiments set forth herein, but embraces all such modified forms thereof as come within the scope of the following claims.

What is claimed is:

1. A digital signal processing hearing aid system comprising:
   (a) input means for providing an electrical input signal corresponding to a sound signal;
   (b) analog to digital converter means for converting the input signal from the input means to input signal digital data at a selected sample rate;
   (c) digital signal processing means for receiving the input signal digital data from the analog to digital converter means and providing processed output data, the digital signal processing means including:
      (1) means for analyzing the input signal data and estimating the energy contained in a plurality of selected frequency bands which cover the range of frequency content of the input signal data, wherein the means for analyzing the input signal data includes a first high pass digital filter for passing the higher half of the input signal frequency range, a first low pass digital filter for passing the lower half of the input signal frequency range and providing a second frequency range signal data, a second high pass digital filter selected to pass the higher half of the second frequency range signal and a second low pass digital filter selected to pass the lower half of the second frequency range signal to provide a third frequency range signal, a third high pass digital filter selected to pass the higher half of the third frequency range signal and a third low pass digital filer selected to pass the lower half of the third frequency range signal to provide a fourth frequency range signal, the fourth high pass filter selected to pass the higher half of the fourth frequency range signal and a fourth low pass digital filter selected to pass the lower half of the fourth frequency range signal, and wherein the means for analyzing further includes means for estimating the energy in the data corresponding to the outputs of the first, second, third, and fourth high pass filters and the fourth low pass filter;

(2) gain calculation means for calculating a gain for each band which is a function of estimated energy in each band;

(3) digital spectral filter means, having a plurality of filter coefficients which are changeable, for receiving the input signal digital data and providing spectrally shaped output data for output from the digital signal processing means;

(4) coefficient calculation means for calculating the coefficients of the digital spectral filter means based on the gains for each band calculated by the gain calculation means, the coefficients of the digital spectral filter means being periodically changed to the new coefficients calculated by the coefficient calculation means;

(d) digital to analog converter means for converting the processed output data from the digital signal processing means to an analog signal; and (e) means for converting the analog signal to a corresponding sound.

2. The hearing aid system of claim 1 wherein the means for estimating the energy in the frequency bands of the input signal data further comprises means for taking the absolute values of the filter outputs and means for low pass filtering these absolute values.

3. The hearing aid system of claim 1 wherein the gain calculation means also includes means for selecting the spectral shaping of the digital spectral filter means to provide spectral shaping to the signal data passed through the spectral filter to compensate for spectrally related deficiencies in the hearing of the user of the hearing aid.

4. The hearing aid system of claim 1 including means for delaying the input signal data provided to the spectral filter means to allow time for the coefficients of the spectral filter to be changed in response to the characteristic of the input signal at the time that the data is provided to the spectral filter.

5. The hearing aid system of claim 1 wherein each high pass filter and low pass filter is a three tap finite impulse response digital filter.

6. The hearing aid system of claim 5 wherein the filter coefficients of each high pass filter are $-1, 2, -1$ and the filter coefficients of each low pass filter are $1, 2, 1$.

7. The hearing aid system of claim 1 wherein the computation of output values of the first high pass and low pass filters is performed at half the sample rate, the computation of output values for the second high pass and low pass filters is performed at one quarter the sample rate, the computation of output values for the third high pass and low pass filters is performed at one 150 of the sample rate, and the computation of output values for the fourth high pass and low pass filters is performed at 1/16 of the sample rate.

8. The hearing aid system of claim 1 wherein the gain calculation means within the digital signal processing means computes gains for each of the frequency bands in accordance with a gain function of the estimated energy including at least a section providing amplitude expansion for selected low level input signals, a linear amplification section for providing constant amplification for intermediate level input signals, and a section providing amplitude compression for high level input signals.

9. The hearing aid system of claim 8 wherein the digital signal processing means includes a programmable memory selectably loaded with processing variables adapted to an individual user.

10. The hearing aid system of claim 9 wherein the processing variables in the programmable memory include the slopes of the expansion section and the compression section for each of the frequency bands in the gain calculation means, and the digital signal data energy envelope positions of the knees at which the expansion section joins the linear amplification section and at which the linear amplification section joins the compression section.

11. The hearing aid system of claim 8 wherein the gain calculation means calculates the gains also as a function of desired base line gains for each of the bands so as to cause the digital input signal passed through the spectral filter means to be spectrally shaped in a manner selected to compensate for the spectral hearing deficit of a user.

12. The hearing aid system of claim 8 wherein the gain calculation means of the digital signal processing means estimates the level of noise as a function of the energy in each of the bands and wherein a knee dividing the expansion section of the nonlinear gain function from the linear section for each band is moved higher or lower as a function of the noise level estimate for that band.

13. The hearing aid system of claim 9 wherein the programmable memory in the digital signal processing means is provided with parameters that define the minimum and maximum values for the position of the knee dividing the expansion section of the gain function from the linear section for each band and wherein the digital signal processing means includes means for estimating the level of noise as a function of the energy estimate of the digital input signal data for each frequency band, and wherein the digital signal processing means moves the knee higher or lower as a function of the noise level estimate but within the limits set by the minimum and maximum values.

14. The hearing aid system of claim 1 including automatic gain control means for controlling the magnitude of the analog signal passed from the input means to the analog to digital converter means, the signal magnitude controlled at a slow rate relative to speech to be within a desired range of magnitudes.

15. The hearing aid system of claim 8 wherein each of the gain functions used in each of the frequency bands by the gain calculation means has a piecewise linear gain function in which the logarithm of the gain is a linearly increasing function of the logarithm of the energy estimate in each band up to a first knee, a constant between the first and a second knee, and a linearly decreasing function above the second knee.

16. The hearing aid system of claim 15 wherein the positions of the first and the second knees are selected so that the constant gain between the first and second knee lies over a preferred dynamic range for the hearing of the individual user in each of the frequency bands.

17. The hearing aid system of claim 15 wherein the gain calculation means includes means for estimating the level of noise as a function of the energy estimate of the digital input signal data in each frequency band and wherein the first knee in each gain function in each frequency band is moved higher or lower as a function of the noise level estimate for that band while the position of the second knee and the slopes of the gain function remain fixed in each band.

18. The hearing aid system of claim 17 wherein the position of the first knee is set equal to the noise level estimate plus a selected constant.

19. The hearing aid system of claim 17 wherein the first knee is moved higher or lower in direct relation to the noise level estimate but no higher than a selected maximum value and no lower than a selected minimum value in determining the gain calculated by the gain calculation means for each frequency band in the digital signal processing means.

20. The hearing aid system of claim 19 wherein the digital signal processor has a programmable memory and wherein the programmable memory is provided with parameters that define the minimum and maximum values of the position of the first knee, the position of the second knee, and the slopes of the gain function.

21. The hearing aid system of claim 17 wherein the means for estimating the level of noise in each frequency band in the gain calculations means estimates the noise level by selecting a percentile of the distribution of the energy estimate for each of the frequency bands.

22. The hearing aid system of claim 19 wherein the position of the first knee is set equal to the noise level estimate plus a selected constant.

23. The hearing aid system of claim 1 including preemphasis filtering means for equalizing the frequency spectrum of the analog signal passed from the input means to the analog to digital converter means to minimize the required dynamic range of the analog to digital converter means.

24. The hearing aid system of claim 1 wherein the gain calculation means in the digital signal processing means determines the gain function for each frequency band periodically, and the coefficient calculation means calculates new filter coefficients periodically based on the new gains, with a time constant in the range of about 1 millisecond to about 2 milliseconds.

25. The hearing aid system of claim 8 wherein for each band the section of the gain function up to the first knee provides an expansion ratio of up to 1:2 and a section above the second knee provides a compression ratio of up to 3.3:1.

26. A digital signal processing hearing aid system comprising:
 (a) input means for providing an electrical signal corresponding to a sound signal;
 (b) analog to digital converter means for converting the signal from the input means to digital data at a selected sample rate;
 (c) digital signal processing means for receiving the input signal digital data from the analog to digital converter means and providing processed output data, the digital signal processing means including:
  (1) N pairs of high pass and low pass digital filters, the high pass filter in each pair selected to pass the highest half of the frequency range of the input signal to the pair and the low pass filter in each pair selected to pass the lowest half of the frequency range of the input signal to the pair, the pairs of filters cascaded so that the input signal to each pair after the first pair is the output of the low pass filter of the prior pair of filters, and means for estimating the energy in the frequency bands corresponding to the outputs of the N high pass filters and the last low pass filter, where N is at least two;
  (2) gain calculation means for calculating a gain for each band which is a function of the estimated energy in each band;
  (3) digital spectral filter means, having a plurality of filter coefficients which are changeable, for receiving the input signal data and providing spectrally shaped output data for output from the digital signal processing means;
  (4) coefficient calculation means for calculating the coefficients of the digital spectral filter means based on the gains for each band calculated by the gain calculation means, the coefficients of the digital spectral filter means being periodically changed to the new coefficients calculated by the coefficient calculation means;
 (d) digital to analog converter means for converting the processed output data from the digital signal processing means to an analog signal; and
 (e) means for converting the analog signal to a corresponding sound.

27. The hearing aid system of claim 26 wherein N=4.

28. The hearing aid system of claim 26 wherein the means for estimating the energy of the output signal data of the N high pass filters and the last low pass filter comprises means for taking the absolute values of the filter outputs and means for low pass filtering these absolute values.

29. The hearing aid system of claim 26 wherein the gain calculation means also includes means for selecting the spectral shaping of the digital spectral filter means to provide spectral shaping to the signal data passed through the spectral filter to compensate for spectrally related deficiencies in the hearing of the user of the hearing aid.

30. The hearing aid system of claim 26 including means for delaying the input signal data provided to the spectral filter means to allow time for the coefficients of the spectral filter to be changed in response to the characteristic of the input signal at the time that the data is provided to the spectral filter.

31. The hearing aid system of claim 26 wherein each high pass filter and low pass filter is a three tap finite impulse response digital filter.

32. The hearing aid system of claim 31 wherein the filter coefficients of each high pass filter are −1, 2, −1 and the filter coefficients of each low pass filter are 1, 2, 1.

33. The hearing aid system of claim 26 wherein the computation of output values of the first pair of high pass and low pass filters is performed at half the sample rate, and the computation of output values for the succeeding pairs of high pass and low pass filters is performed at rate which is a fraction of the sample rate equal to $\frac{1}{2}^{n+1}$, where n is the number of prior filter pairs.

34. The hearing aid system of claim 26 wherein there are four pairs of high pass and low pass filters, with the output of the first high pass filter passing the portion of the input signal from approximately 4,000 Hz to 8,000 Hz, the second high pass filter passing the portion of the input signal data in the range of 2,000 Hz to 4,000 Hz, the third high pass filter passing the portion of the signal data in the range of 1,000 Hz to 2,000 Hz, the fourth high pass filter passing the signal data in the range of 500 Hz to 1000 Hz, and the fourth low pass filter passing the portion of the input signal data in the range from 0 to 500 Hz.

35. The hearing aid system of claim 26 wherein the gain calculation means within the digital signal processing means computes gains for each of the frequency bands in accordance with a gain function of the estimated energy including at least a section providing amplitude expansion for selected low level input signals, a linear amplification section for providing constant amplification for intermediate level input signals, and a section providing amplitude compression for high level input signals.

36. The hearing aid system of claim 35 wherein the digital signal processing means includes a programmable memory selectably loaded with processing variables adapted to an individual user.

37. The hearing aid system of claim 36 wherein the processing variables in the programmable memory include the slopes of the expansion section and the compression section for each of the frequency bands in the gain calculation means, and the digital signal data energy envelope positions of the knees at which the expansion section joins the linear amplification section and at which the linear amplification section joins the compression section.

38. The hearing aid system of claim 35 wherein the gain calculation means calculates the gains also as a function of desired base line gains for each of the bands so as to cause the digital input signal passed through the spectral filter means to be spectrally shaped in a manner selected to compensate for the spectral hearing deficit of a user.

39. The hearing aid system of claim 35 wherein the gain calculation means of the digital signal processing means estimates the level of noise as a function of the energy in each of the bands and wherein a knee dividing the expansion section of the nonlinear gain function from the linear section for each band is moved higher or lower as a function of the noise level estimate for that band.

40. The hearing aid system of claim 36 wherein the programmable memory in the digital signal processing means is provided with parameters that define the minimum and maximum values for the position of the knee dividing the expansion section of the gain function from the linear section for each band and wherein the digital signal processing means includes means for estimating the level of noise as a function of the energy estimate of the digital input signal data for each frequency band, and wherein the digital signal processing means moves the knee higher or lower as a function of the noise level estimate but within the limits set by the minimum and maximum values.

41. The hearing aid system of claim 26 including automatic gain control means for controlling the magnitude of the analog signal passed from the input means to the analog to digital converter means, the signal magnitude controlled at a slow rate relative to speech to be within a desired range of magnitudes.

42. The hearing aid system of claim 35 wherein each of the gain functions used in each of the frequency bands by the gain calculation means has a piecewise linear gain function in which the logarithm of the gain is a linearly increasing function of the logarithm of the energy estimate in each band up to a first knee, a constant between the first and a second knee, and a linearly decreasing function above the second knee.

43. The hearing aid system of claim 42 wherein the positions of the first and the second knees are selected so that the constant gain between the first and second knee lies over a preferred dynamic range for the hearing of the individual user in each of the frequency bands.

44. The hearing aid system of claim 42 wherein the gain calculation means includes means for estimating the level of noise as a function of the energy estimate of the digital input signal data in each frequency band and wherein the first knee in each gain function in each frequency band is moved higher or lower as a function of the noise level estimate for that band while the position of the second knee and the slopes of the gain function remained fixed in each band.

45. The hearing aid system of claim 44 wherein the position of the first knee is set equal to the noise level estimate plus a selected constant.

46. The hearing aid system of claim 44 wherein the first knee is moved higher or lower in direct relation to the noise level estimate but no higher than a selected maximum value and no lower than a selected minimum value in determining the gain calculated by the gain calculation means for each frequency band in the digital signal processing means.

47. The hearing aid system of claim 46 wherein the digital signal processor has a programmable memory and wherein the programmable memory is provided with parameters that define the minimum and maximum values of the position of the first knee, the position of the second knee, and the slopes of the gain function.

48. The hearing aid system of claim 44 wherein the means for estimating the level of noise in each frequency band in the gain calculations means estimates the noise level by selecting a percentile of the distribution of the energy estimate for each of the frequency bands.

49. The hearing aid system of claim 46 wherein the position of the first knee is set equal to the noise level estimate plus a selected constant.

50. The hearing aid system of claim 26 including pre-emphasis filtering means for equalizing the frequency spectrum of the analog signal passed from the input means to the analog to digital converter means to minimize the required dynamic range of the analog to digital converter means.

51. The hearing aid system of claim 26 wherein the gain calculation means in the digital signal processing means determines the gain function for each frequency band periodically, and the coefficient calculation means calculates new filter coefficients periodically based on the new gains, with a time constant in the range of about 1 millisecond to about 2 milliseconds.

52. The hearing aid system of claim 35 wherein the section of the gain function up to the first knee provides an expansion ratio of up to 1:2 and a section above the second knee provides a compression ratio of up to 3.3:1.

53. A digital spectral analysis filter comprising:
  (a) input means for providing an electrical signal corresponding to a sound signal;
  (b) analog to digital converter means for converting the signal from the input means to digital data at a selected sample rate;
  (c) digital signal processing means for receiving the input signal digital data from the analog to digital converter means and providing processed output data, the digital signal processing means including N pairs of high pass and low pass digital filters, the high pass filter in each pair selected to pass the highest half of the frequency range of the input signal to the pair and the low pass filter in each pair selected to pass the lowest half of the frequency range of the input signal to the pair, the pairs of filters cascaded so that the input signal to each pair after the first pair is the output of the low pass filter of the prior pair of filters, where N is at least two, and wherein the computation of output values of the first pair of high pass and low pass filters is performed at half the sample rate and the computation of output values for succeeding pairs of high pass and low pass filters is performed at a rate which is a fraction of the sample rate equal to $\frac{1}{2}^{n+1}$, where n is the number of prior filter pairs.

54. The digital spectral analysis filter of claim 53 further including means for estimating the energy in the outputs of the N high pass filters and the last low pass filter.

55. The digital spectral analysis filter of claim 53 wherein each high pass filter and low pass filter is a three tap finite impulse response digital filter.

56. The digital spectral analysis filter of claim 53 wherein the filter coefficients of each high pass ilter are $-1, 2, -1$ and the filter coefficients of each low pass filter 1, 2, 1.

57. The digital spectral analysis filter of claim 53 wherein the frequency range of interest is from 0 to 8,000 Hz, N=4, and the first high pass filter passes the portion of the input signal from approximately 4,000 Hz to 8,000 Hz, the second high pass filter passes the portion of the input signal data in the range of 2,000 Hz to 4,000 Hz, the third high pass filter passes the portion of the signal data in the range of 1000 to 2000 Hz, the fourth high pass filter passes the portion of the signal data in the range of 500 Hz to 1,000 Hz, and the fourth low pass filter passes the portion of the input signal data in the range of 0 to 500 Hz.

58. The digital spectral analysis filter of claim 53 wherein the means for estimating the energy of the filter output signal data comprises means for taking the absolute values of the filter outputs and means for low pass filtering these absolute values.

* * * * *